(12) United States Patent
Min et al.

(10) Patent No.: US 11,776,857 B2
(45) Date of Patent: *Oct. 3, 2023

(54) SEMICONDUCTOR DEVICE

(71) Applicant: SAMSUNG ELECTRONICS CO., LTD., Suwon-si (KR)

(72) Inventors: Sunki Min, Seoul (KR); Donghyun Roh, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/567,403

(22) Filed: Jan. 3, 2022

(65) Prior Publication Data

US 2022/0122894 A1 Apr. 21, 2022

Related U.S. Application Data

(60) Continuation of application No. 16/793,997, filed on Feb. 18, 2020, now Pat. No. 11,239,120, which is a (Continued)

(30) Foreign Application Priority Data

Aug. 3, 2017 (KR) .................. 10-2017-0098636

(51) Int. Cl.
*H01L 21/8238* (2006.01)
*H01L 21/8234* (2006.01)
(Continued)

(52) U.S. Cl.
CPC .... *H01L 21/823821* (2013.01); *H01L 21/764* (2013.01); *H01L 21/76229* (2013.01);
(Continued)

(58) Field of Classification Search
CPC ............ H01L 27/0886; H01L 27/0924; H01L 21/823821; H01L 21/832431
See application file for complete search history.

(56) References Cited

U.S. PATENT DOCUMENTS 7,074,662 B2 7/2006 Lee et al.
7,078,286 B1 7/2006 Mehta
(Continued)

FOREIGN PATENT DOCUMENTS

CN 106057803 A 10/2016
CN 106098772 A 11/2016
(Continued)

*Primary Examiner* — Erik Kielin
(74) *Attorney, Agent, or Firm* — Sughrue Mion, PLLC

(57) ABSTRACT

A method for manufacturing a semiconductor device includes forming a first active fin and a second active fin on a first active region and a second active region of a substrate, respectively, forming a device isolation layer to cover sidewalls of lower portions of the first active fin and the second active fin, forming a first liner layer and a second liner layer to cover upper portions of the first active fin and the second active fin, respectively, forming a first gate electrode and a second gate electrode on the first active fin and the second active fin, respectively, and forming a first source/drain region and a second source/drain region on the first active fin and the second active fin, respectively. The first liner layer includes a different material from a material of the second liner layer.

19 Claims, 61 Drawing Sheets

Related U.S. Application Data division of application No. 15/907,573, filed on Feb. 28, 2018, now Pat. No. 10,580,702.

(51) Int. Cl.
*H01L 21/762* (2006.01)
*H01L 21/764* (2006.01)
*H01L 27/092* (2006.01)
*H01L 27/088* (2006.01)
*H01L 29/417* (2006.01)

(52) U.S. Cl.
CPC .............. *H01L 21/823425* (2013.01); *H01L 21/823431* (2013.01); *H01L 21/823468* (2013.01); *H01L 21/823481* (2013.01); *H01L 21/823864* (2013.01); *H01L 27/0886* (2013.01); *H01L 27/0924* (2013.01); *H01L 21/823814* (2013.01); *H01L 21/823878* (2013.01); *H01L 29/41791* (2013.01)

(56) References Cited

U.S. PATENT DOCUMENTS

| | | |
|---|---|---|
| 7,535,061 B2 | 5/2009 | Lee et al. |
| 7,902,035 B2 | 3/2011 | Yu et al. |
| 8,748,989 B2 | 6/2014 | Lin et al. |
| 8,963,279 B2 | 2/2015 | Sandhu |
| 9,159,832 B2 | 10/2015 | Chang et al. |
| 9,337,260 B2 | 5/2016 | Liou et al. |
| 9,343,370 B1 | 5/2016 | Lee et al. |
| 9,349,632 B2 | 5/2016 | Zhou |
| 9,419,134 B2 | 8/2016 | Lee et al. |
| 9,443,757 B1 | 9/2016 | Tsai et al. |
| 9,553,194 B1 | 1/2017 | Licausi et al. |
| 9,614,059 B2 | 4/2017 | Colinge |
| 9,627,268 B2 | 4/2017 | Chang et al. |
| 9,704,737 B2 | 7/2017 | Feng et al. |
| 9,728,643 B2 | 8/2017 | Park et al. |
| 11,107,734 B2 | 8/2021 | Lee et al. |
| 11,239,120 B2 * | 2/2022 | Min ............... H01L 21/823481 |
| 2014/0036297 A1 | 2/2014 | Arai |
| 2015/0108544 A1 | 4/2015 | Ching et al. |
| 2016/0284697 A1 | 9/2016 | Yoon |
| 2016/0322492 A1 | 11/2016 | Kang et al. |
| 2016/0329329 A1 | 11/2016 | Chen et al. |
| 2016/0343709 A1 | 11/2016 | Kim et al. |
| 2016/0351570 A1 | 12/2016 | Park et al. |
| 2016/0379982 A1 | 12/2016 | You et al. |
| 2017/0025313 A1 | 1/2017 | Ching |
| 2017/0103985 A1 | 4/2017 | Kim et al. |
| 2017/0117411 A1 * | 4/2017 | Kim .................... H01L 29/7848 |
| 2017/0125299 A1 | 5/2017 | Pranatharthiharan |
| 2017/0125541 A1 | 5/2017 | Pranatharthiharan et al. |
| 2017/0148914 A1 | 5/2017 | Lee |
| 2017/0229463 A1 * | 8/2017 | Bergendahl ......... H01L 29/0847 |
| 2017/0256613 A1 | 9/2017 | Fung |
| 2018/0182845 A1 | 6/2018 | Seong |

FOREIGN PATENT DOCUMENTS

| | | |
|---|---|---|
| CN | 106206595 A | 12/2016 |
| TW | I582998 B | 5/2017 |

* cited by examiner

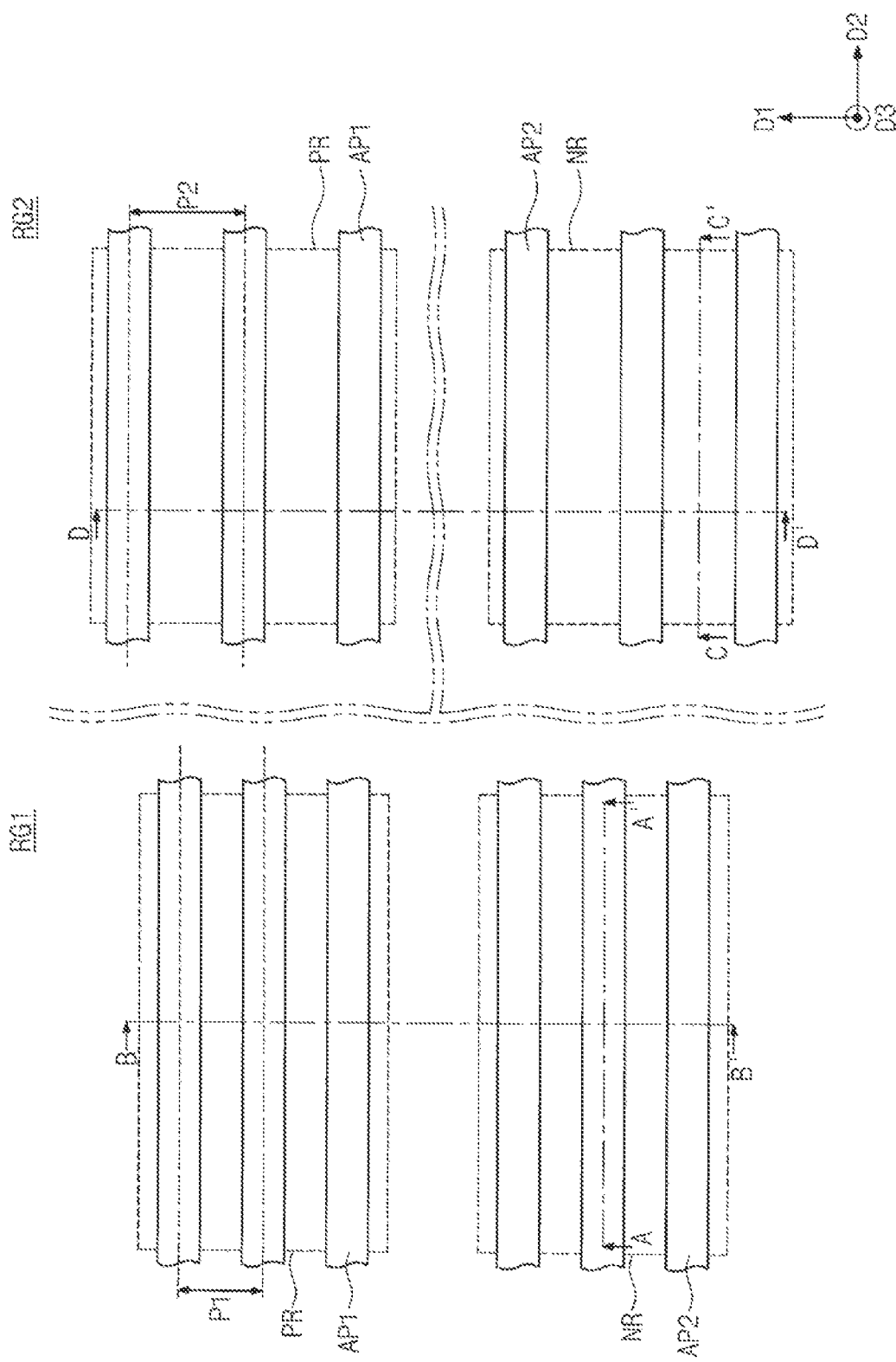

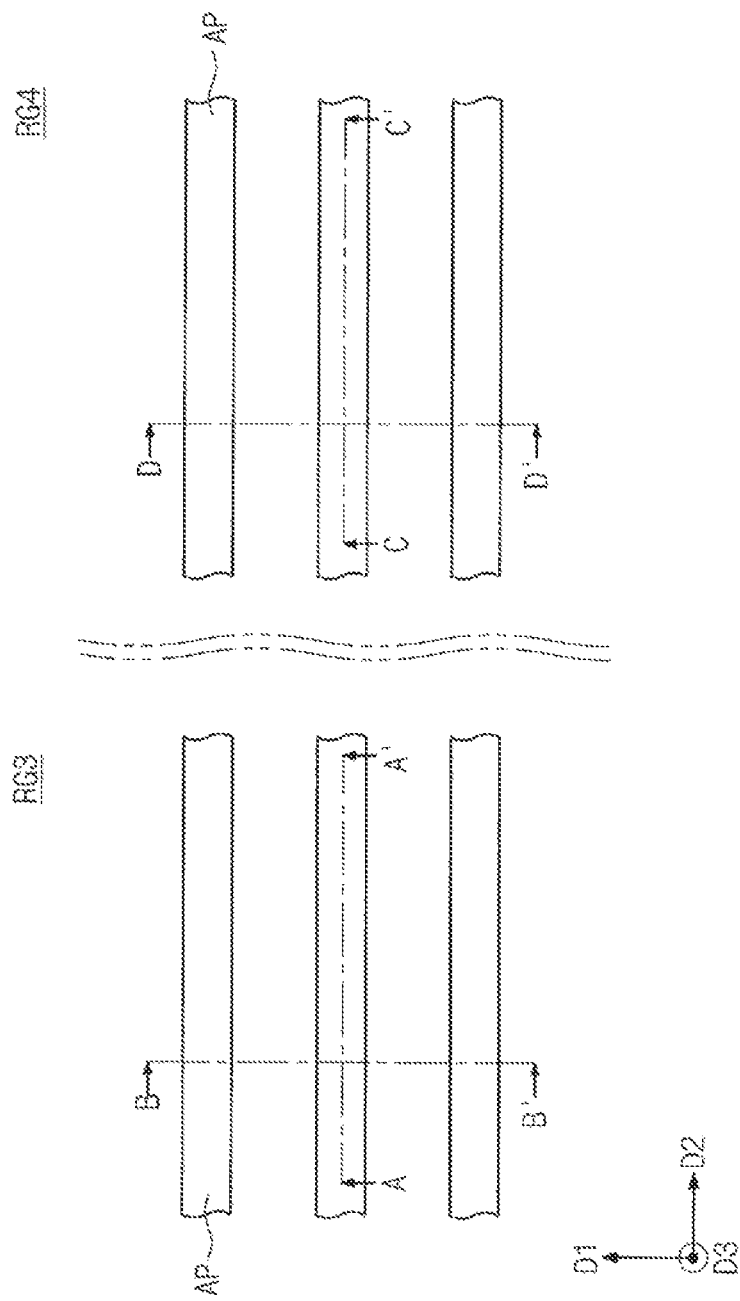

FIG. 16A
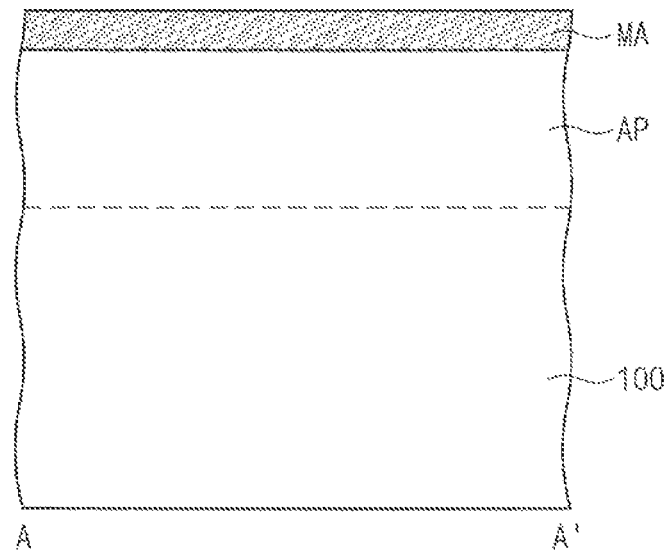
FIG. 16B
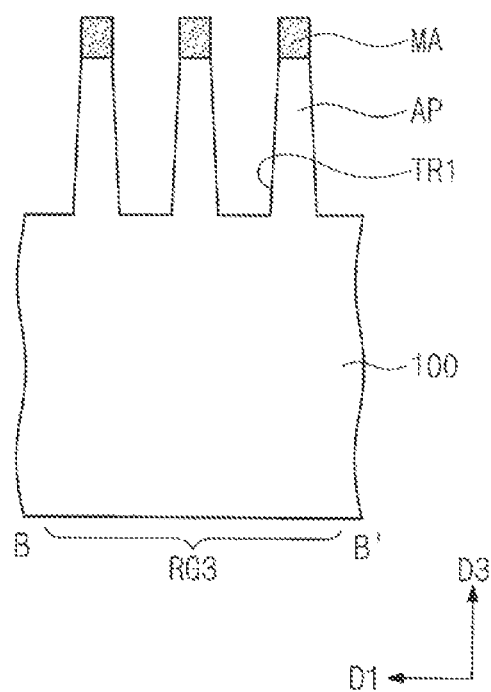

FIG. 16C
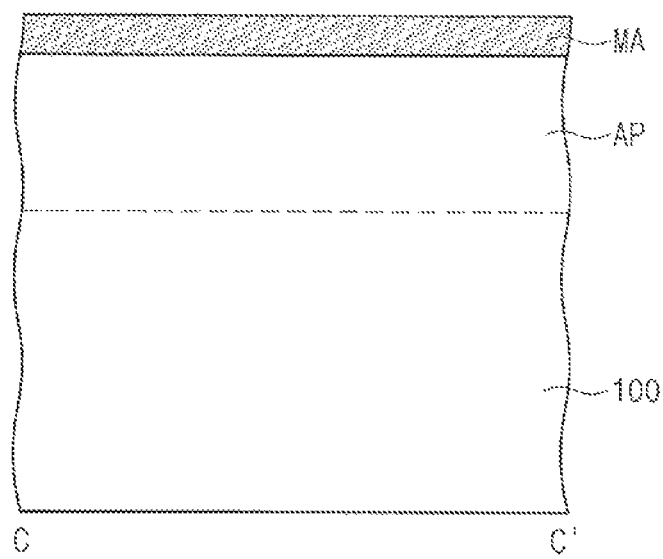
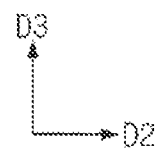
FIG. 16D
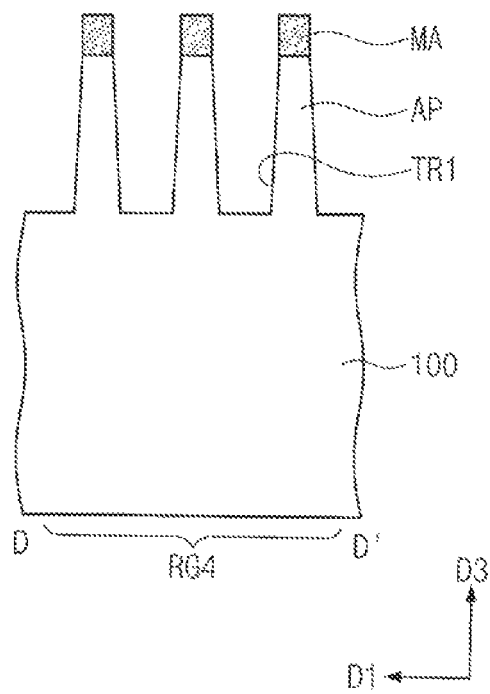

FIG. 18C
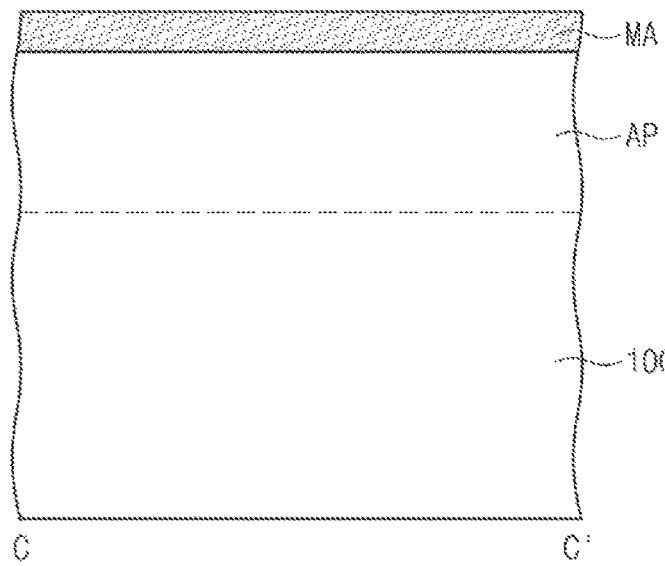
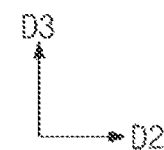
FIG. 18D
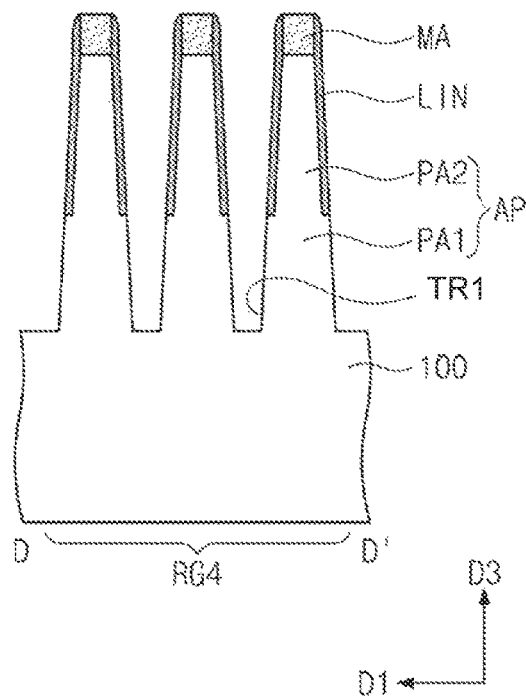
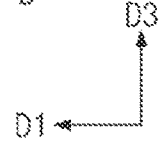

FIG. 19C
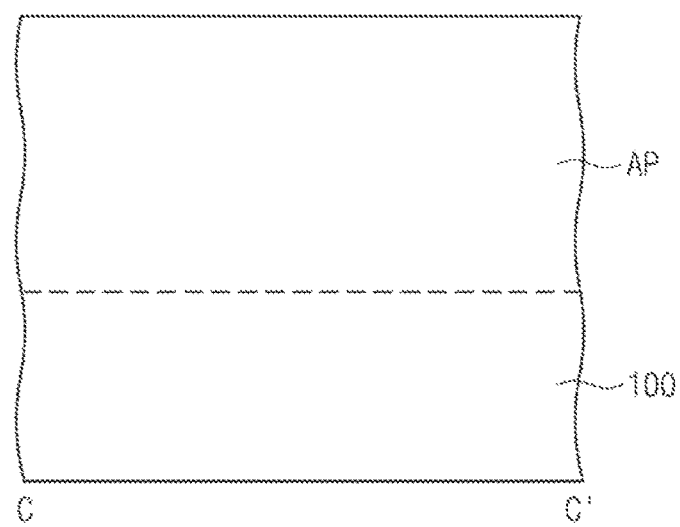
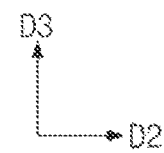
FIG. 19D
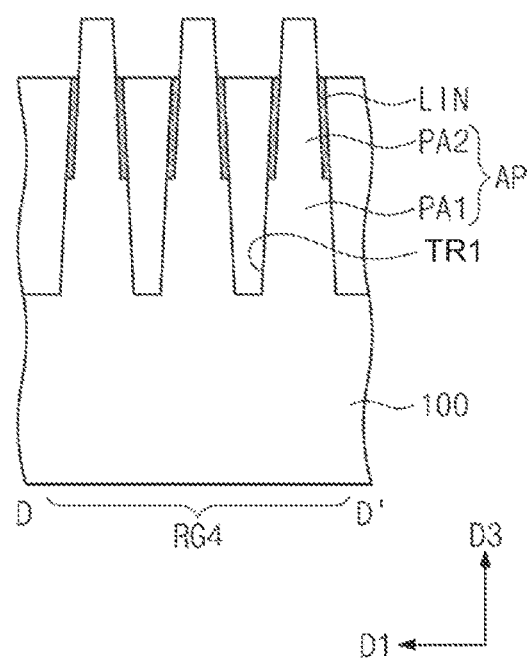

SEMICONDUCTOR DEVICE

CROSS-REFERENCE TO RELATED APPLICATION

This application is a Continuation of U.S. application Ser. No. 16/793,997, filed Feb. 18, 2020, which is a Divisional of U.S. application Ser. No. 15/907,573, filed Feb. 28, 2018 (now U.S. Pat. No. 10,580,702), which claims priority under 35 U.S.C. § 119 to Korean Patent Application No. 10-2017-0098636, filed on Aug. 3, 2017, in the Korean Intellectual Property Office, the disclosures of each of which are hereby incorporated by reference in their entireties.

BACKGROUND

Embodiments of the inventive concepts relate to semiconductor devices and, more particularly, to semiconductor devices including field effect transistors.

Semiconductor devices are widely used in the electronic industry because of their small sizes, multi-functional characteristics, and/or low manufacturing costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices with excellent characteristics have been in increasing demand with the development of the electronic industry. For example, high-reliable, high-speed, and/or multi-functional semiconductor devices have been in increasing demand. To satisfy the demand, semiconductor devices have been highly integrated and structures of semiconductor devices have become more and more complicated.

SUMMARY

Embodiments of the inventive concepts may provide a semiconductor device including a field effect transistor with improved electrical characteristics.

In an aspect, a semiconductor device includes first active patterns and second active patterns on a substrate, a first source/drain region on the first active patterns, a second source/drain region on the second active patterns and a device isolation layer filling a first trench between adjacent ones of the first active patterns and a second trench between adjacent ones of the second active patterns. A liner layer is disposed on the device isolation layer between the adjacent ones of the second active patterns. The device isolation layer between the adjacent ones of the first active patterns has a recess therein under the first source/drain region and a bottom surface of the liner layer between the adjacent ones of the second active patterns is higher than the recess.

In an aspect, a semiconductor device includes a substrate having a first region and a second region, first active patterns on the first region, second active patterns on the second region, and a device isolation layer defining the first and second active patterns on the first and second regions. A residual spacer layer is disposed on the device isolation layer between adjacent ones of the first active patterns. A liner layer is disposed on the device isolation layer between adjacent ones of the second active patterns. A pitch between the second active patterns is greater than a pitch between the first active patterns and a bottom surface of the residual spacer layer is higher than a bottom surface of the liner layer.

In an aspect, a semiconductor device includes an active fin on a substrate, a device isolation layer covering a sidewall of a lower portion of the active fin, a source/drain region on the active fin and a protective insulating layer covering a sidewall of an upper portion of the active fin and the source/drain region. A thickness of the protective insulating layer on the sidewall of the upper portion of the active fin is greater than a thickness of the protective insulating layer on the source/drain region.

BRIEF DESCRIPTION OF THE DRAWINGS

The inventive concepts will become more apparent in view of the attached drawings and accompanying detailed description.

FIGS. 3, 6, 8, and 10 are plan views illustrating a method for manufacturing a semiconductor device according to some embodiments of the inventive concepts.

FIG. 15 is a plan view illustrating a method for manufacturing a semiconductor device according to some embodiments of the inventive concepts.

FIGS. 16A, 17A, 18A, and 19A are cross-sectional views taken along a line A-A' of FIG. 15.

FIGS. 16B, 17B, 18B, and 19B are cross-sectional views taken along a line B-B' of FIG. 15.

FIGS. 16C, 17C, 18C, and 19C are cross-sectional views taken along a line C-C' of FIG. 15.

FIGS. 16D, 17D, 18D, and 19D are cross-sectional views taken along a line D-D' of FIG. 15.

DETAILED DESCRIPTION OF THE EMBODIMENTS

Figure 1:
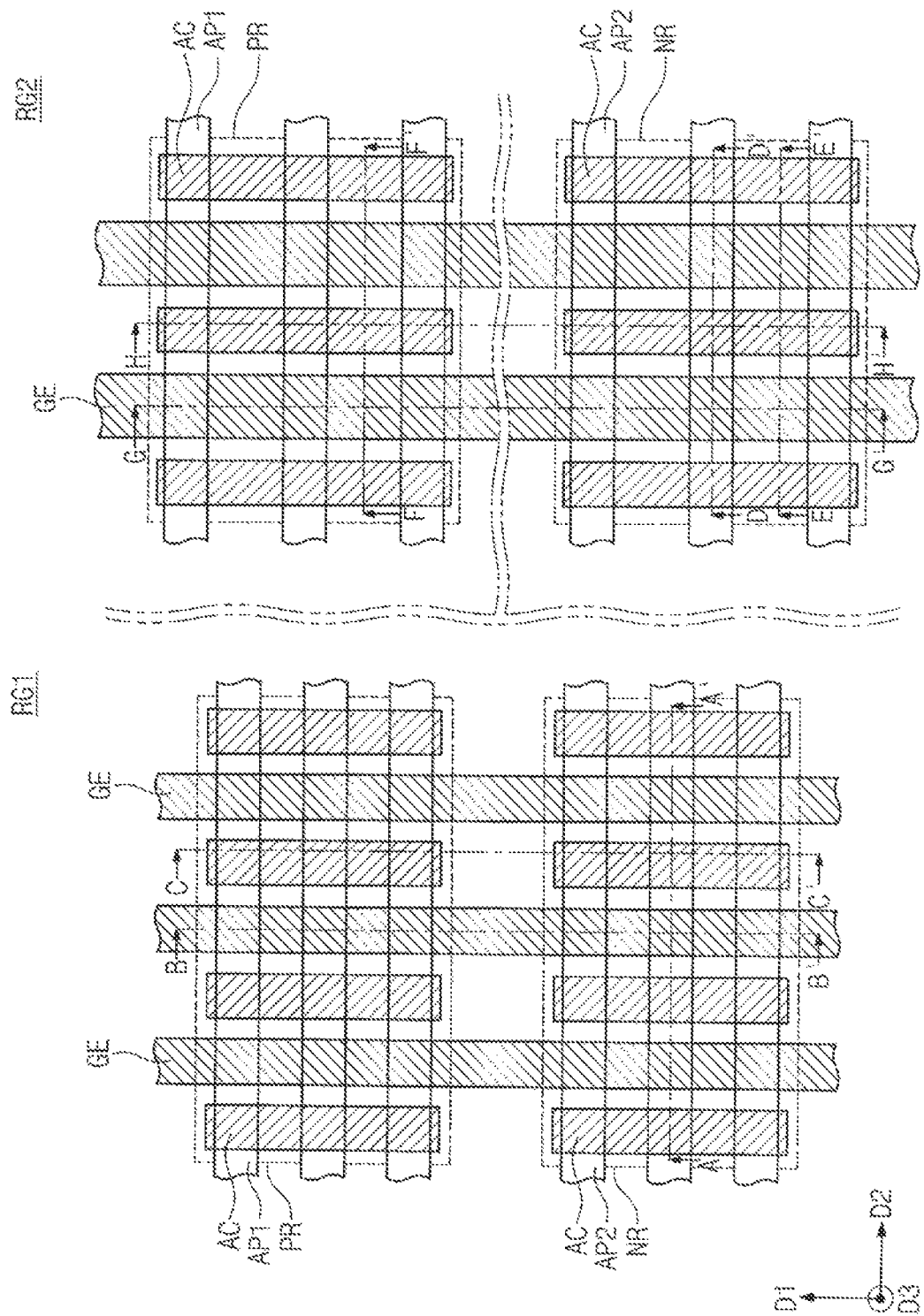
FIG. 1 is a plan view illustrating a semiconductor device according to some embodiments of the inventive concepts.

FIG. 1 is a plan view illustrating a semiconductor device according to some embodiments of the inventive concepts. FIGS. 2A to 2H are cross-sectional views taken along lines A-A', B-B', C-C', D-D', E-E', F-F', G-G', and H-H' of FIG. 1, respectively.

A substrate 100 having a first region RG1 and a second region RG2 may be provided. First, the first region RG1 of the substrate 100 will be described hereinafter in detail with reference to FIGS. 1 and 2A to 2C. The first region RG1 of the substrate 100 may include a PMOSFET region PR and an NMOSFET region NR. The substrate 100 may be a semiconductor substrate including silicon, germanium, or silicon-germanium or may be a compound semiconductor substrate. For example, the substrate 100 may be a silicon substrate. The first region RG1 may be a logic cell region on which logic transistors constituting a logic circuit of a semiconductor device are disposed. For example, logic transistors constituting a processor core may be disposed on the first region RG1 (i.e., the logic cell region) of the substrate 100. Some of the logic transistors may be disposed on the first region RG1.

A device isolation layer ST may be provided in an upper portion of the substrate 100. The device isolation layer ST may include an insulating material such as a silicon oxide layer. The PMOSFET region PR and the NMOSFET region NR may be spaced apart from each other in a first direction D1 with the device isolation layer ST interposed therebetween. The first direction D1 may be parallel to a top surface of the substrate 100. The PMOSFET region PR and the NMOSFET region NR may extend in a second direction D2 intersecting the first direction D1. The device isolation layer ST between the PMOSFET region PR and the NMOSFET region NR may be deeper than the device isolation layer ST between active patterns AP1 or AP2.

A plurality of the active patterns AP1 and AP2 extending in the second direction D2 may be provided on the PMOSFET region PR and the NMOSFET region NR. The active patterns AP1 and AP2 may include first active patterns AP1 on the PMOSFET region PR and second active patterns AP2 on the NMOSFET region NR. The first and second active patterns AP1 and AP2 may be portions of the substrate 100, which may protrude from a surface of the substrate 100. The first and second active patterns AP1 and AP2 may be arranged in the first direction D1.

First trenches TR1 may be defined between the first active patterns AP1 adjacent to each other and between the second active patterns AP2 adjacent to each other. A second trench TR2 may be defined between the PMOSFET region PR and the NMOSFET region NR adjacent to each other. The device isolation layer ST may fill the first and second trenches TR1 and TR2.

Figure 2A:
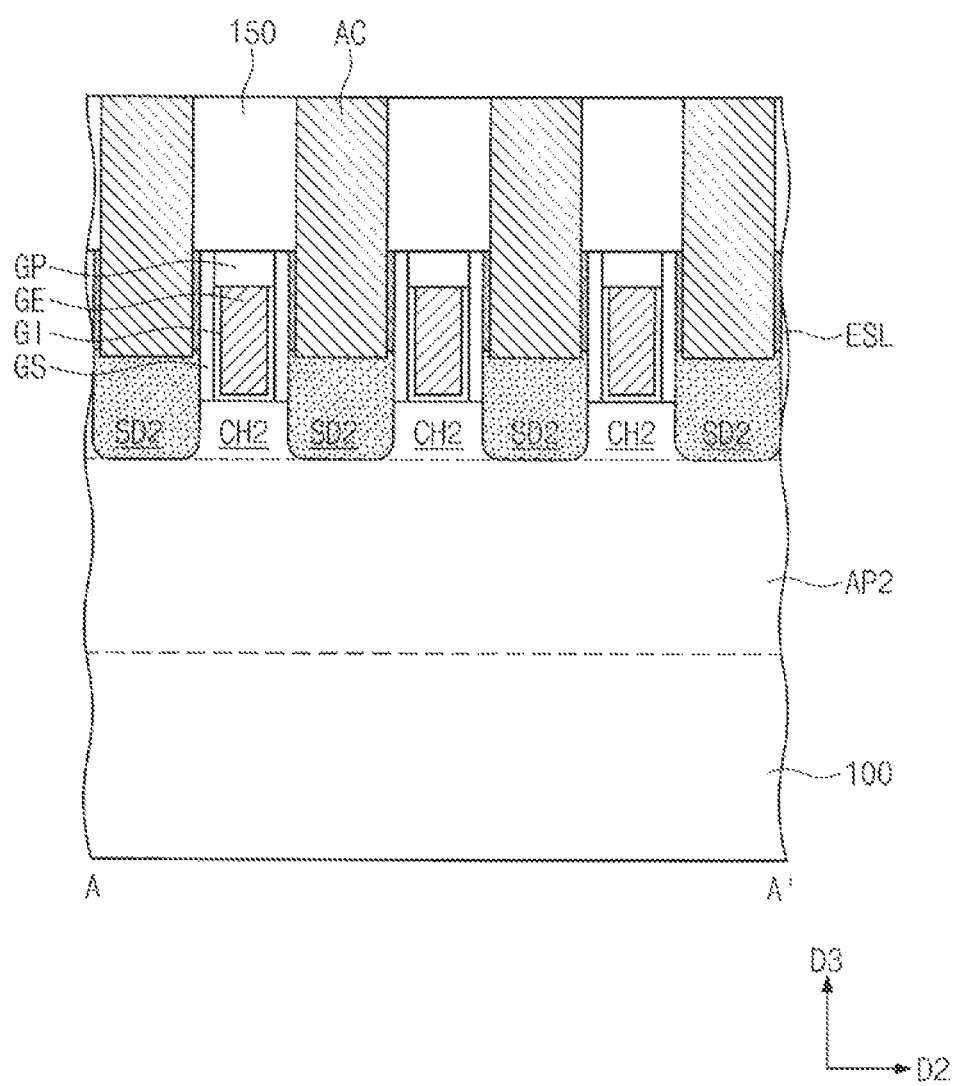
FIGS. 2A to 2H are cross-sectional views taken along lines A-A', B-B', C-C', D-D', E-E', F-F', G-G', and H-H' of FIG. 1, respectively.
Figure 2B:
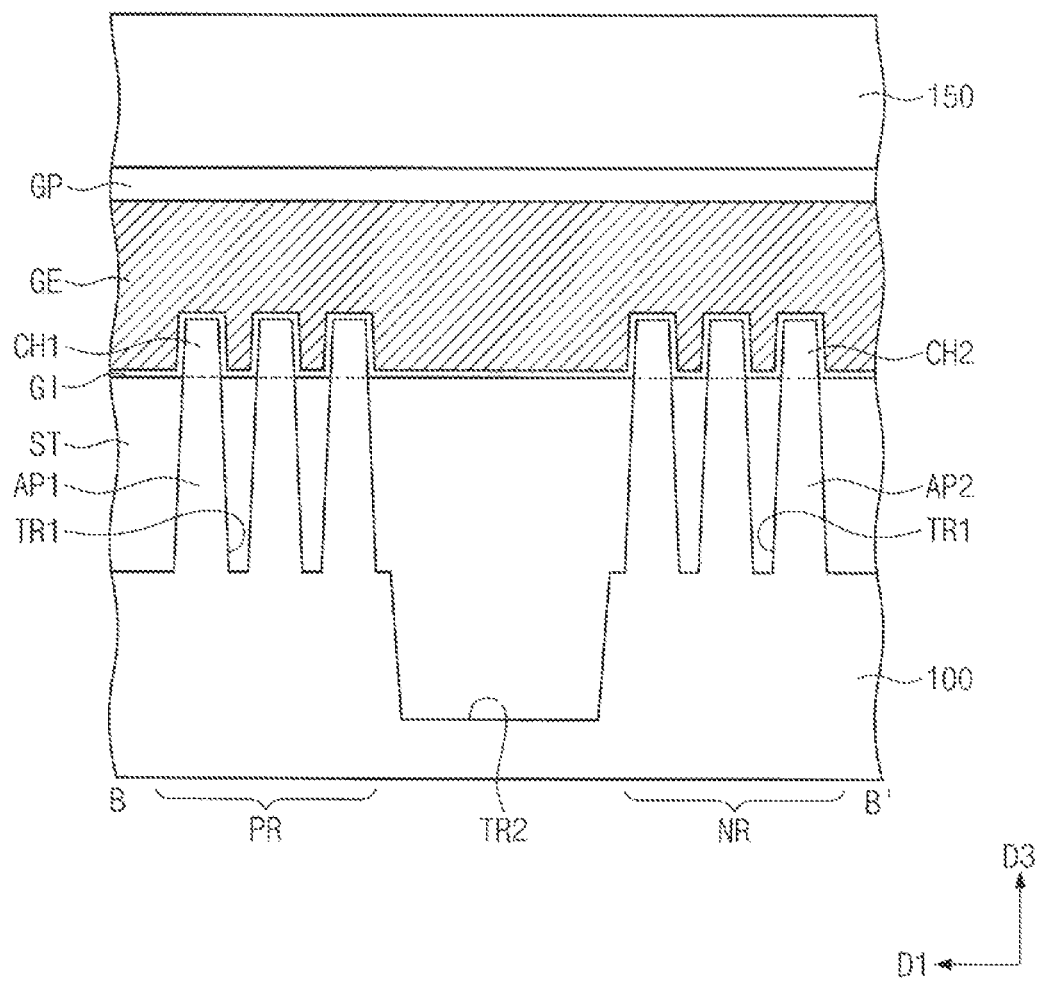
Figure 2C:
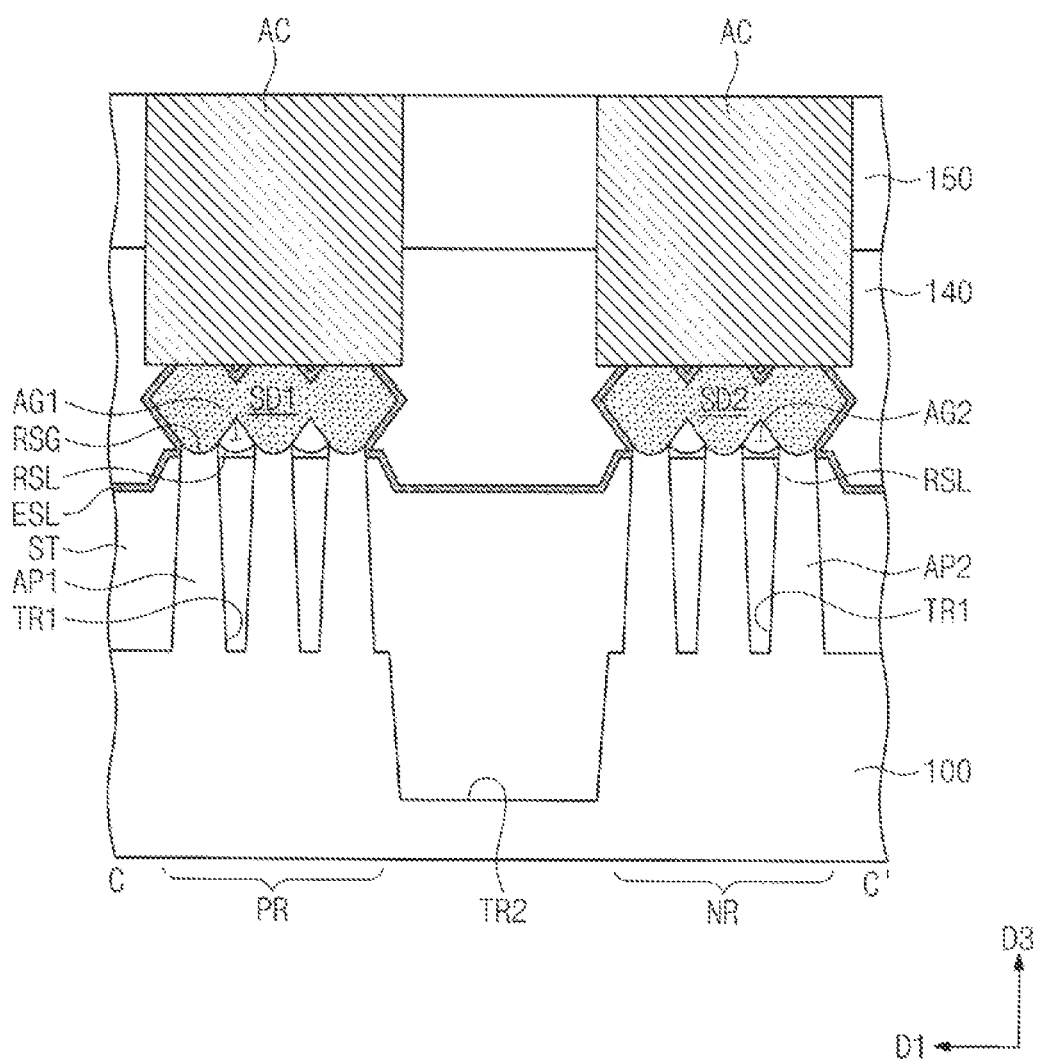
Figure 2D:
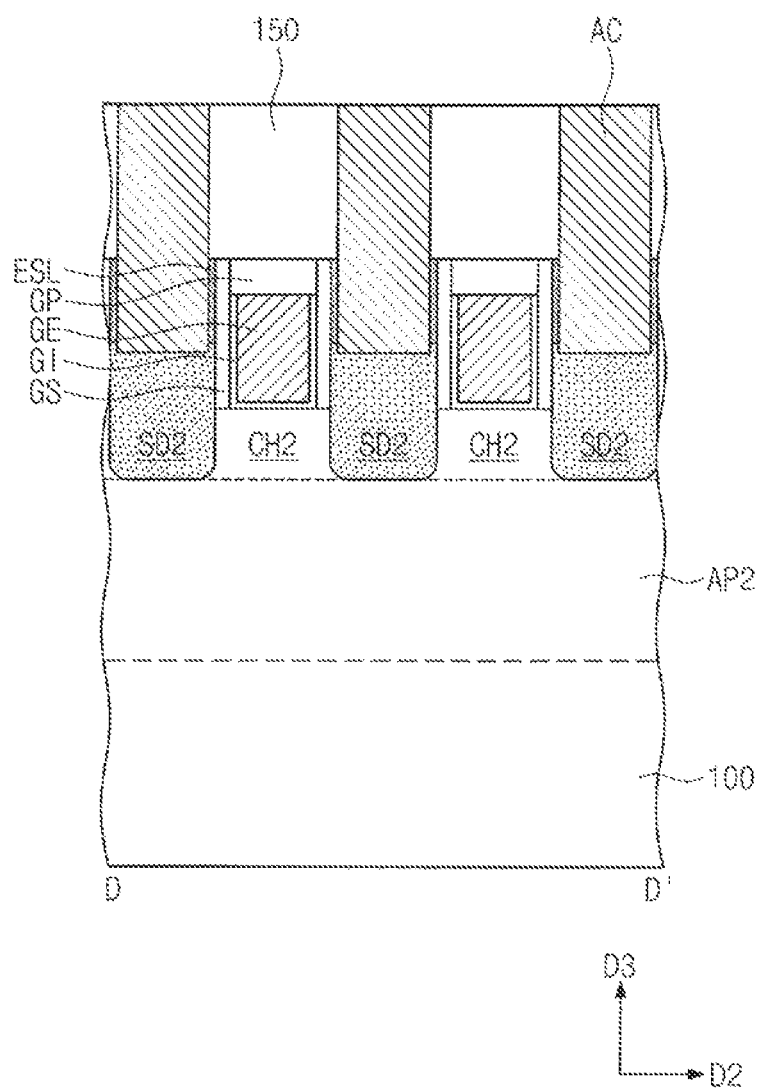
Figure 2E:
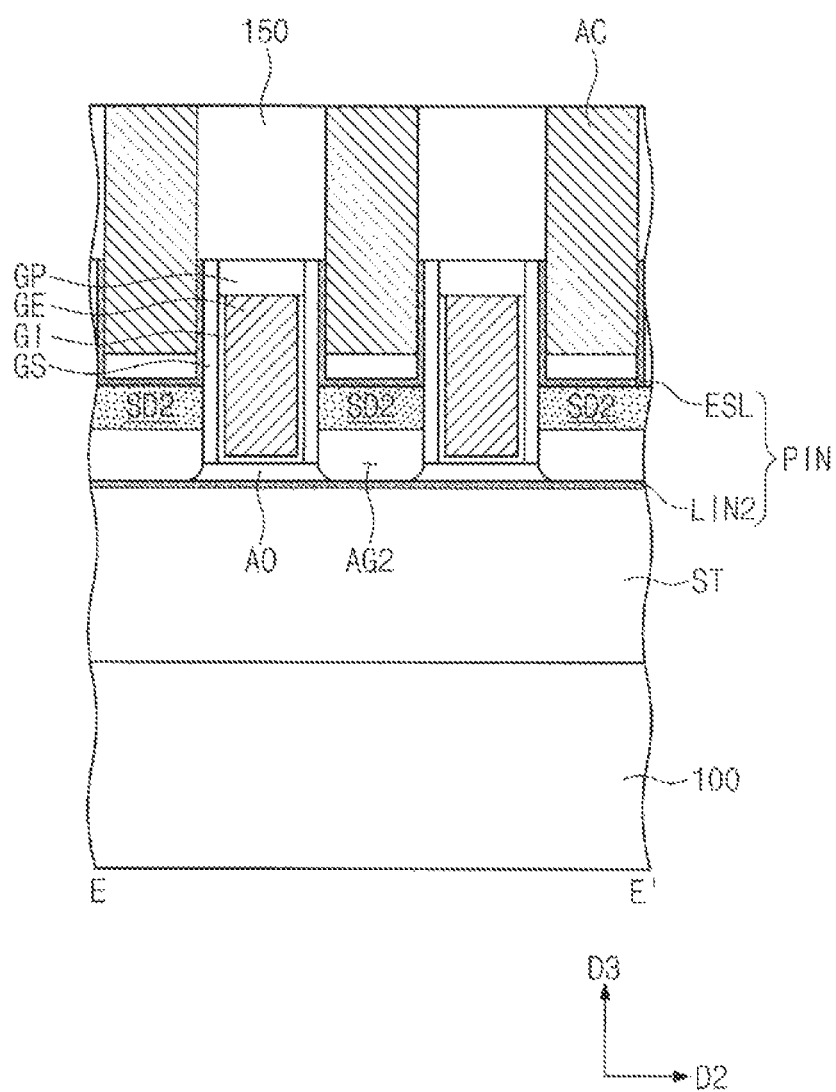
Figure 2F:
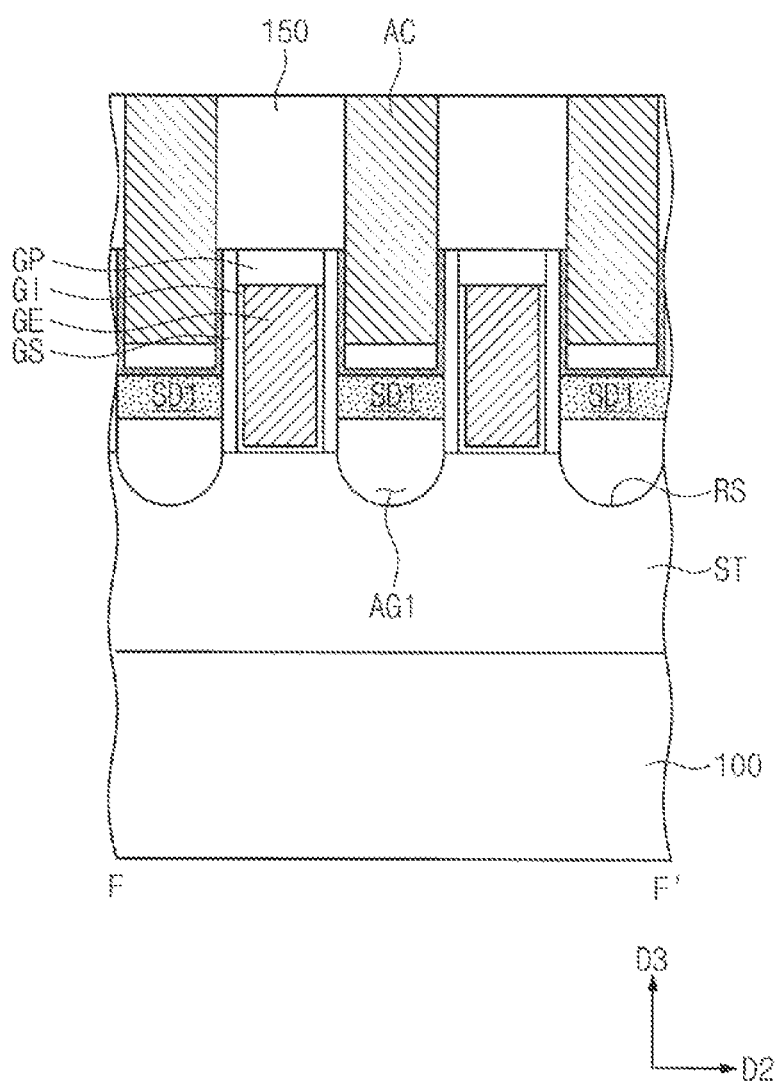
Figure 2G:
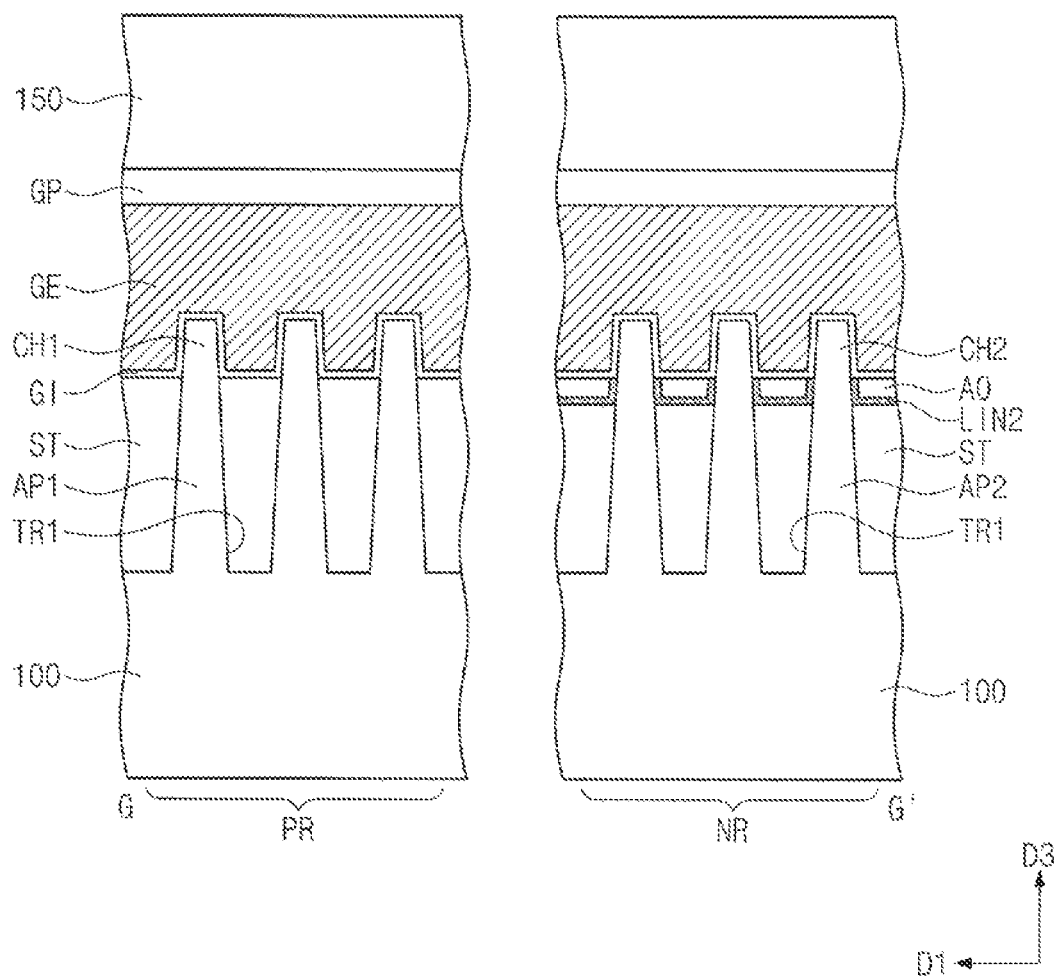

The device isolation layer ST filling the first trenches TR1 may define the first and second active patterns AP1 and AP2. The device isolation layer ST may directly cover sidewalls of lower portions of the first and second active patterns AP1 and AP2. In FIGS. 1, 2B, and 2C, three first active patterns AP1 are illustrated on the PMOSFET region PR and three second active patterns AP2 are illustrated on the NMOSFET region NR. However, embodiments of the inventive concepts are not limited thereto.

Upper portions of the first and second active patterns AP1 and AP2 may be higher than a top surface of the device isolation layer ST. The upper portions of the first and second active patterns AP1 and AP2 may vertically protrude from the device isolation layer ST. The upper portions of the first and second active patterns AP1 and AP2 may have fin-shapes protruding from the device isolation layer ST.

The upper portions of the first active patterns AP1 may include first channel regions CH1 and first source/drain regions SD1. The first source/drain regions SD1 may be P-type dopant regions. Each of the first channel regions CH1 may be disposed between a pair of the first source/drain regions SD1 adjacent to each other. In some embodiments, three first active patterns AP1 adjacent to each other in the first direction D1 may share one first source/drain region SD1.

The upper portions of the second active patterns AP2 may include second channel regions CH2 and second source/drain regions SD2. The second source/drain regions SD2 may be N-type dopant regions. Each of the second channel regions CH2 may be disposed between a pair of the second source/drain regions SD2 adjacent to each other. In some embodiments, three second active patterns AP2 adjacent to each other in the first direction D1 may share one second source/drain region SD2.

The first and second source/drain regions SD1 and SD2 may include epitaxial patterns formed by a selective epitaxial growth (SEG) process. Top surfaces of the first and second source/drain regions SD1 and SD2 may be disposed at a higher level than top surfaces of the first and second channel regions CH1 and CH2. In some embodiments, the epitaxial patterns adjacent to each other in the first direction D1 on the PMOSFET region PR may be connected to each other to constitute one first source/drain region SD1 on the first active patterns AP1. The epitaxial patterns adjacent to each other in the first direction D1 on the NMOSFET region NR may be connected to each other to constitute one second source/drain region SD2 on the second active patterns AP2.

The first source/drain regions SD1 may include a semiconductor element of which a lattice constant is greater than that of the semiconductor element of the substrate 100. Thus, the first source/drain regions SD1 may provide compressive stress to the first channel regions CH1. For example, the first source/drain regions SD1 may include silicon-germanium (SiGe). The second source/drain regions SD2 may include a semiconductor element of which a lattice constant is equal to or smaller than that of the semiconductor element of the substrate 100. For example, the second source/drain regions SD2 may include the same semiconductor element (e.g., silicon) as the substrate 100.

Residual spacer layers RSL may be provided between the first source/drain region SD1 and the device isolation layer ST and between the second source/drain region SD2 and the device isolation layer ST. Each of the residual spacer layers RSL may cover the top surface of the device isolation layer ST. The residual spacer layers RSL may include the same material as gate spacers GS.

A first air gap AG1 may be defined between the first source/drain region SD1 and the residual spacer layer RSL. The residual spacer layer RSL may define a bottom of the first air gap AG1. A second air gap AG2 may be defined between the second source/drain region SD2 and the residual spacer layer RSL. The residual spacer layer RSL may define a bottom of the second air gap AG2.

Gate electrodes GE extending in the first direction D1 may be provided on the first and second active patterns AP1 and AP2 to intersect the first and second active patterns AP1 and AP2. The gate electrodes GE may be spaced apart from each other in the second direction D2. The gate electrodes GE may vertically overlap with the first and second channel regions CH1 and CH2. Each of the gate electrodes GE may surround a top surface and both sidewalls of each of the first and second channel regions CH1 and CH2 (see FIG. 2B). For example, the gate electrodes GE may include at least one of a conductive metal nitride (e.g., titanium nitride or tantalum nitride) or a metal material (e.g., titanium, tantalum, tungsten, copper, or aluminum).

A pair of gate spacers GS may be disposed on both sidewalls of each of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 140 to be described later. The gate spacers GS may include at least one of SiCN, SiCON, or SiN. In certain embodiments, each of the gate spacers GS may have a multi-layered structure formed of at least two of SiCN, SiCON, or SiN.

Gate dielectric patterns GI may be disposed between the gate electrodes GE and the active patterns AP1 and AP2. Each of the gate dielectric patterns GI may extend along a bottom surface of each of the gate electrodes GE. Each of the gate dielectric patterns GI may cover the top surface and the both sidewalls of each of the first and second channel regions CH1 and CH2. The gate dielectric patterns GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate capping pattern GP may be provided on each of the gate electrodes GE. The gate capping patterns GP may extend along the gate electrodes GE in the first direction D1. The gate capping patterns GP may include a material having an etch selectivity with respect to first and second interlayer insulating layers 140 and 150 to be described later. For example, the gate capping patterns GP may include at least one of SiON, SiCN, SiCON, or SiN.

A first interlayer insulating layer 140 may be provided on the substrate 100. The first interlayer insulating layer 140 may cover the gate spacers GS and the first and second source/drain regions SD1 and SD2. A top surface of the first interlayer insulating layer 140 may be substantially coplanar with top surfaces of the gate capping patterns GP and the top surfaces of the gate spacers GS.

An etch stop layer ESL may be disposed between the first interlayer insulating layer 140 and the gate spacers GS, between the first interlayer insulating layer 140 and the source/drain regions SD1 and SD2, and between the first interlayer insulating layer 140 and the device isolation layer ST. For example, the etch stop layer ESL may include a silicon nitride layer. A second interlayer insulating layer 150 may be disposed on the first interlayer insulating layer 140 and the gate capping patterns GP. For example, each of the first and second interlayer insulating layers 140 and 150 may include a silicon oxide layer.

The top surface of the device isolation layer ST between the first channel regions CH1 and the second channel regions CH2 spaced apart from each other in the first direction D1 may be higher than the top surface of the device isolation layer ST between the first source/drain region SD1 and the second source/drain region SD2 spaced apart from each other in the first direction D1 (see FIGS. 2B and 2C). In other words, the top surface of the device isolation layer ST under the gate electrode GE may be higher than the top surface of the device isolation layer ST under the first interlayer insulating layer 140.

At least one contact AC may penetrate the second and first interlayer insulating layers 150 and 140 between a pair of the gate electrodes GE so as to be electrically connected to the first and/or second source/drain regions SD1 and/or SD2. For example, the contact AC may include at least one selected from metal materials such as aluminum, copper, tungsten, molybdenum, and cobalt.

Even though not shown in the drawings, a barrier layer may be disposed between the contact(s) AC and the source/drain regions SD1 and SD2. The barrier layer may include a metal layer and/or a metal nitride layer. The metal layer may include at least one of titanium, tantalum, tungsten, nickel, cobalt, or platinum. The metal nitride layer may include at least one of a titanium nitride layer, a tantalum nitride layer, a tungsten nitride layer, a nickel nitride layer, a cobalt nitride layer, or a platinum nitride layer.

Hereinafter, the second region RG2 of the substrate 100 will be described in detail with reference to FIGS. 1 and 2D to 2H. Hereinafter, the descriptions to the same technical features as mentioned with reference to FIGS. 1 and 2A to 2C will be omitted or mentioned briefly for the purpose of ease and convenience in explanation.

The second region RG2 of the substrate 100 may include a PMOSFET region PR and an NMOSFET region NR. The second region RG2 may be a peripheral circuit region of the semiconductor device. In some embodiments, the second region RG2 may be a peripheral circuit region on which high-voltage transistors constituting an input/output (I/O) terminal are disposed.

First active patterns AP1 may be provided on the PMOSFET region PR, and second active patterns AP2 may be provided on the NMOSFET region NR. A distance (or a pitch), in the first direction D1, between the first active patterns AP1 of the second region RG2 may be greater than a distance (or a pitch), in the first direction D1, between the first active patterns AP1 of the first region RG1. A distance (or a pitch), in the first direction D1, between the second active patterns AP2 of the second region RG2 may be greater than a distance (or a pitch), in the first direction D1, between the second active patterns AP2 of the first region RG1. A width of each of the first and second active patterns AP1 and AP2 of the second region RG2 may be substantially equal to a width of each of the first and second active patterns AP1 and AP2 of the first region RG1.

Upper portions of the first active patterns AP1 may include first channel regions CH1 and first source/drain regions SD1. Upper portions of the second active patterns AP2 may include second channel regions CH2 and second source/drain regions SD2. In some embodiments, the first source/drain regions SD1 of the first active patterns AP1 adjacent to each other in the first direction D1 may constitute one pattern (i.e., one first source/drain region SD1) in which three epitaxial patterns adjacent to each other in the first direction D1 are merged with each other. The second source/drain regions SD2 of the second active patterns AP2 adjacent to each other in the first direction D1 may constitute one pattern (i.e., one second source/drain region SD2) in which three epitaxial patterns adjacent to each other in the first direction D1 are merged with each other.

A size of the first source/drain region SD1 of the second region RG2 may be greater than a size of the first source/drain region SD1 of the first region RG1, and a size of the second source/drain region SD2 of the second region RG2 may be greater than a size of the second source/drain region SD2 of the first region RG1.

On the second region RG2, a first air gap AG1 under the first source/drain region SD1 may be greater than a second air gap AG2 under the second source/drain region SD2. A device isolation layer ST under the first air gap AG1 may have a recessed top surface RS. In other words, the device isolation layer ST under the first air gap AG1 may be recessed toward a bottom surface of the substrate 100. The recessed top surface RS of the device isolation layer ST under the first air gap AG1 may be lower than a top surface of a device isolation layer ST under the second air gap AG2. In some embodiments, unlike the first region RG1, the residual spacer layer RSL may not exist in the first and second air gaps AG1 and AG2 of the second region RG2.

A protective insulating layer PIN may be provided on the NMOSFET region NR of the second region RG2. The protective insulating layer PIN may include a second liner layer LIN2 and an etch stop layer ESL. The second liner layer LIN2 may cover the top surface of the device isolation layer ST on the NMOSFET region NR of the second region RG2. The second liner layer LIN2 may also cover sidewalls of upper portions of the second active patterns AP2 under the second source/drain region SD2. The second liner layer LIN2 may define a bottom of the second air gap AG2 of the second region RG2. The second liner layer LIN2 may not exist between the second channel regions CH2 and the gate electrodes GE. A bottom surface of the second liner layer LIN2 may be higher than the recessed top surface RS of the device isolation layer ST under the first air gap AG1.

The second liner layer LIN2 may prevent the second active patterns AP2 from leaning. In more detail, the second liner layer LIN2 may reduce or minimize stress applied to the second active patterns AP2. For example, the second liner layer LIN2 may include the same material (e.g., a silicon nitride layer) as the etch stop layer ESL. The silicon nitride layer may provide tensile stress to the second active patterns AP2, and thus electrical characteristics of an N-channel MOS field effect transistor (NMOSFET) may be improved. In addition, the silicon nitride layer may protect the second source/drain region SD2.

The protective insulating layer PIN may cover the sidewalls of the upper portions of the second active patterns AP2 and the second source/drain region SD2. A thickness T1 of the protective insulating layer PIN on the sidewall of the upper portion of at least one of the second active patterns AP2 may be greater than a thickness T2 of the protective insulating layer PIN on the second source/drain region SD2. This may be because the protective insulating layer PIN on the sidewall of the upper portion of at least one of the second active patterns AP2 includes the second liner layer LIN2 and the etch stop layer ESL but the protective insulating layer PIN on the second source/drain region SD2 includes only the etch stop layer ESL.

A width of each of the gate electrodes GE of the second region RG2 may be greater than a width of each of the gate electrodes GE of the first region RG1. The recessed top surface RS of the device isolation layer ST on the PMOSFET region PR of the second region RG2 may be lower than a bottom surface of the gate electrode GE adjacent thereto. Insulating patterns AO may be disposed between the second liner layer LIN2 and the gate electrodes GE on the NMOSFET region NR of the second region RG2. The second air gap AG2 of the second region RG2 may be surrounded by the gate spacers GS adjacent to each other, the insulating patterns AO adjacent to each other, the second source/drain region SD2, and the second liner layer LIN2 (see FIGS. 2E and 2H). For example, the insulating patterns AO may include the same material (e.g., a silicon oxide layer) as the device isolation layer ST.

Figure 4A:
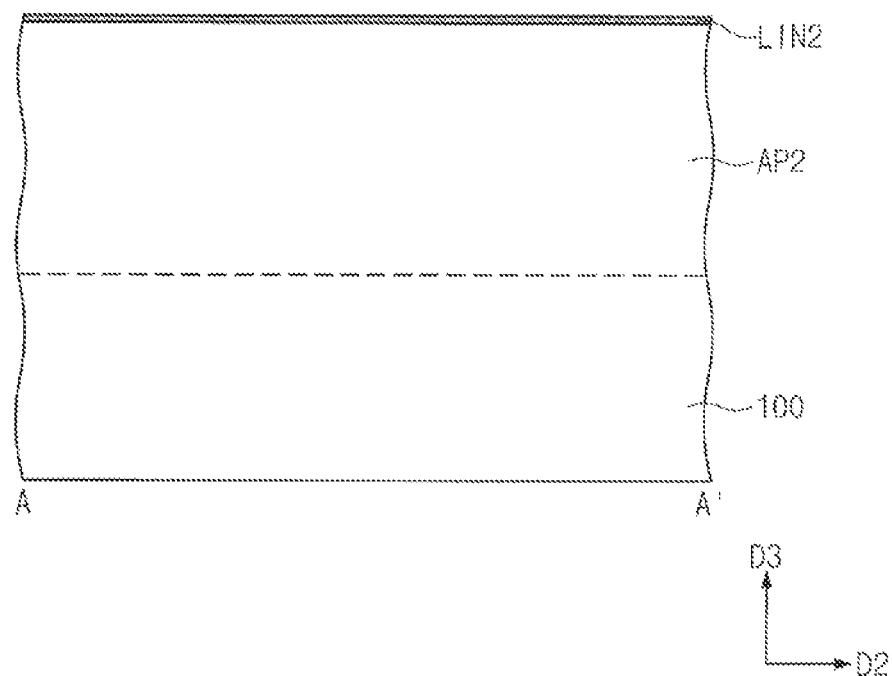
FIGS. 4A and 5A are cross-sectional views taken along a line A-A' of FIG. 3.
Figure 4B:
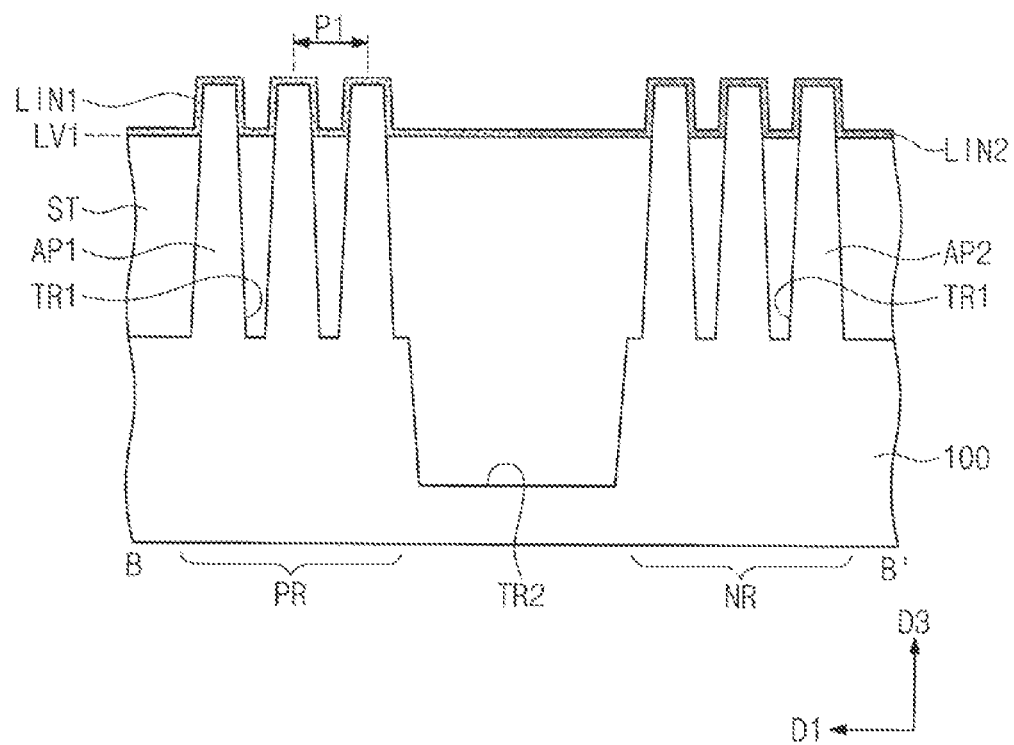
FIGS. 4B and 5B are cross-sectional views taken along a line B-B' of FIG. 3.
Figure 4C:
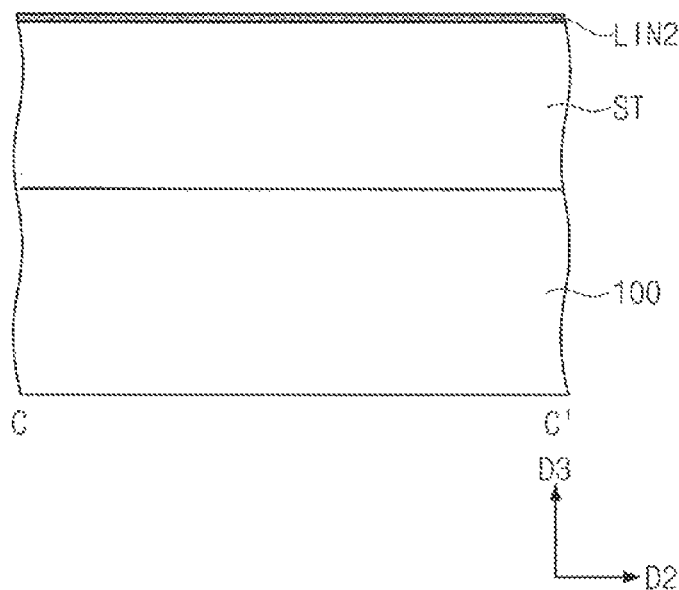
FIGS. 4C and 5C are cross-sectional views taken along a line C-C' of FIG. 3.
Figure 4D:
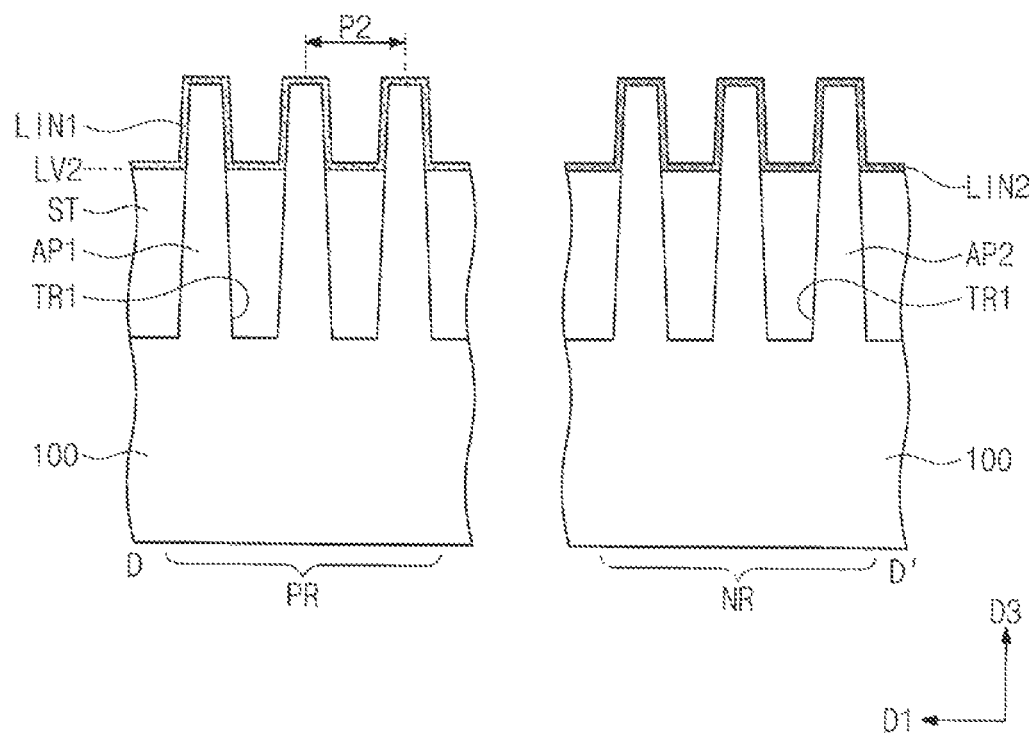
FIGS. 4D and 5D are cross-sectional views taken along a line D-D' of FIG. 3.
Figure 5A:
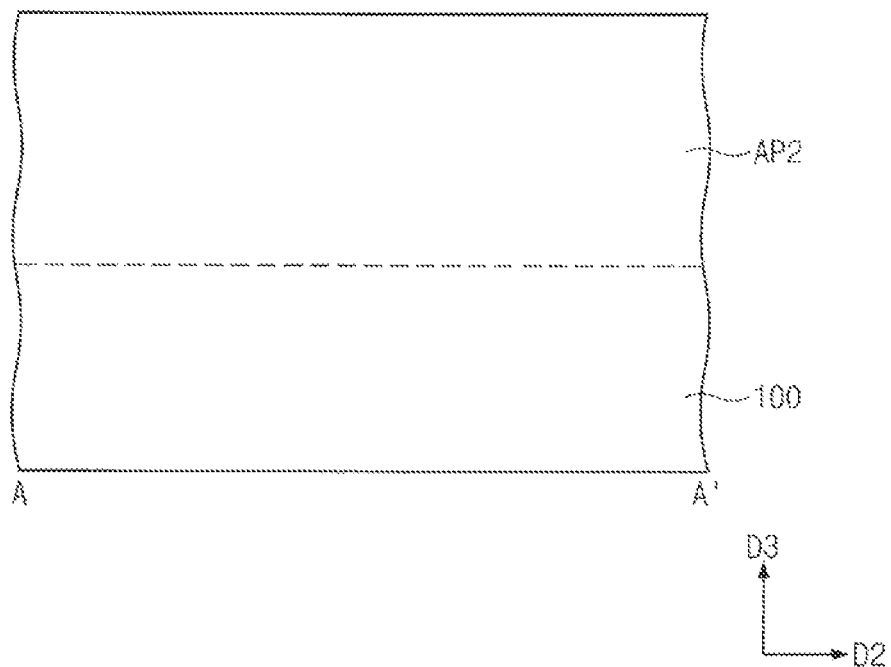
Figure 5B:
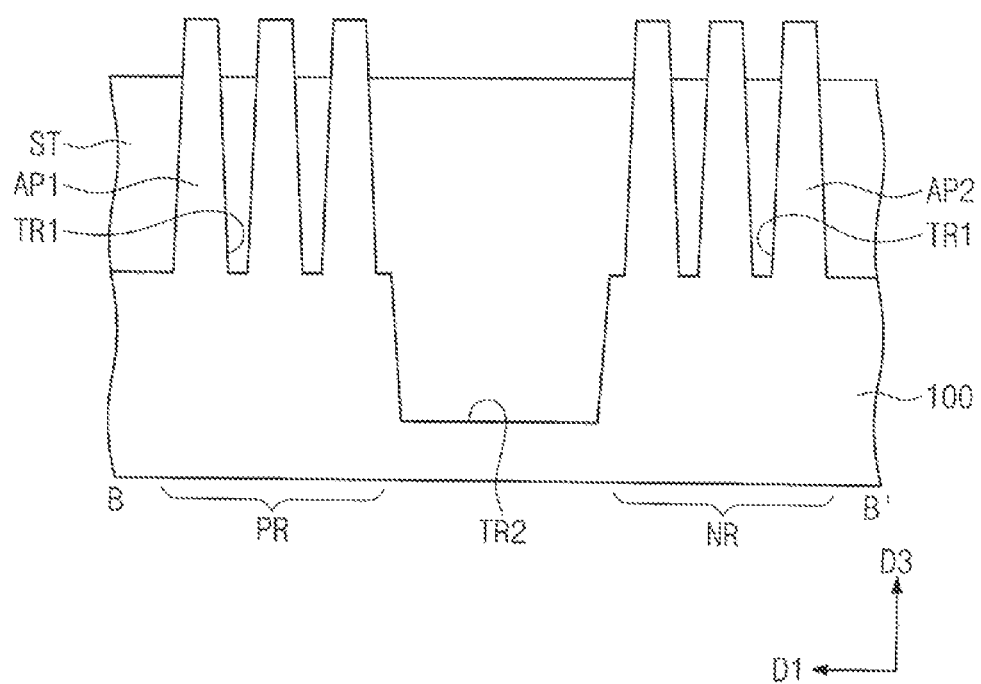
Figure 5C:
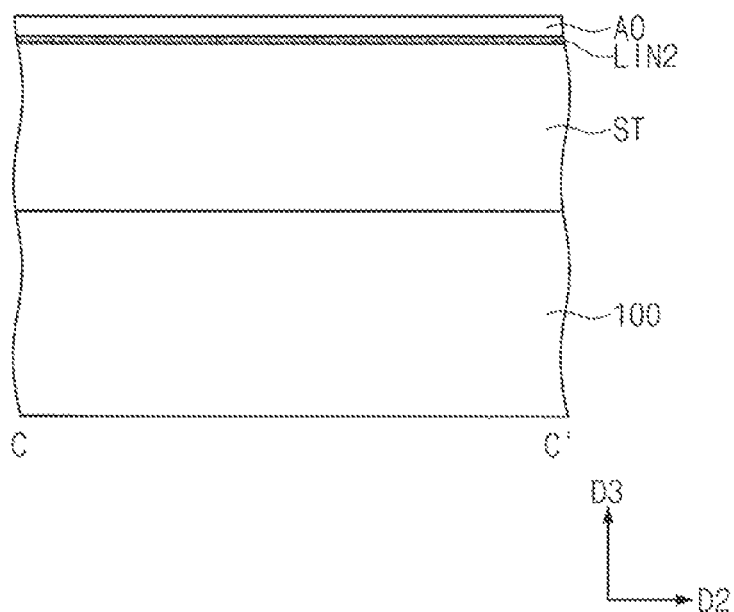
Figure 5D:
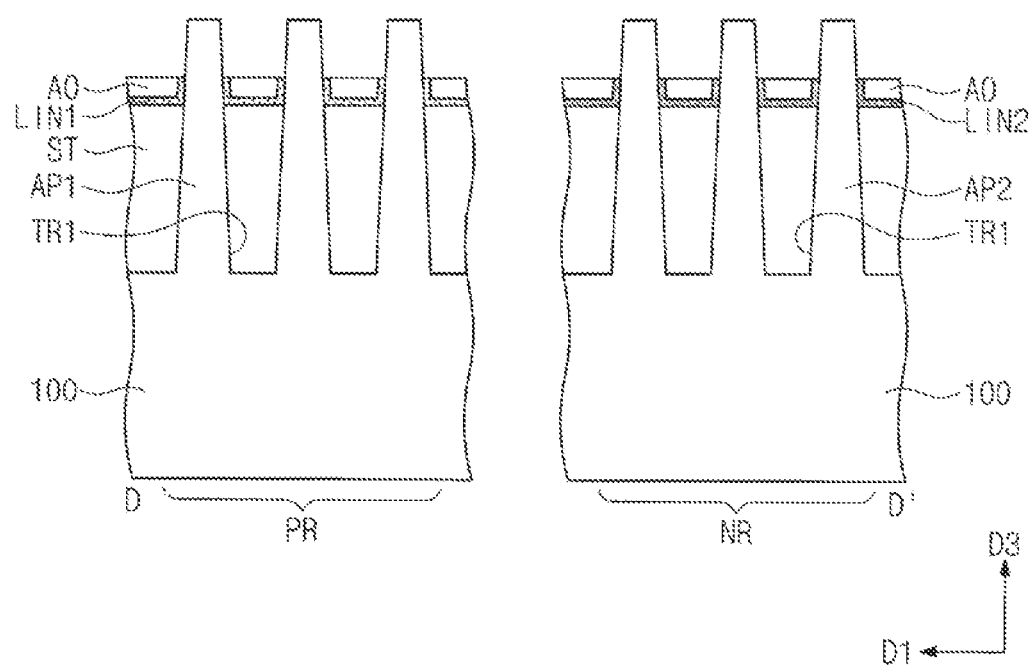
Figure 6:
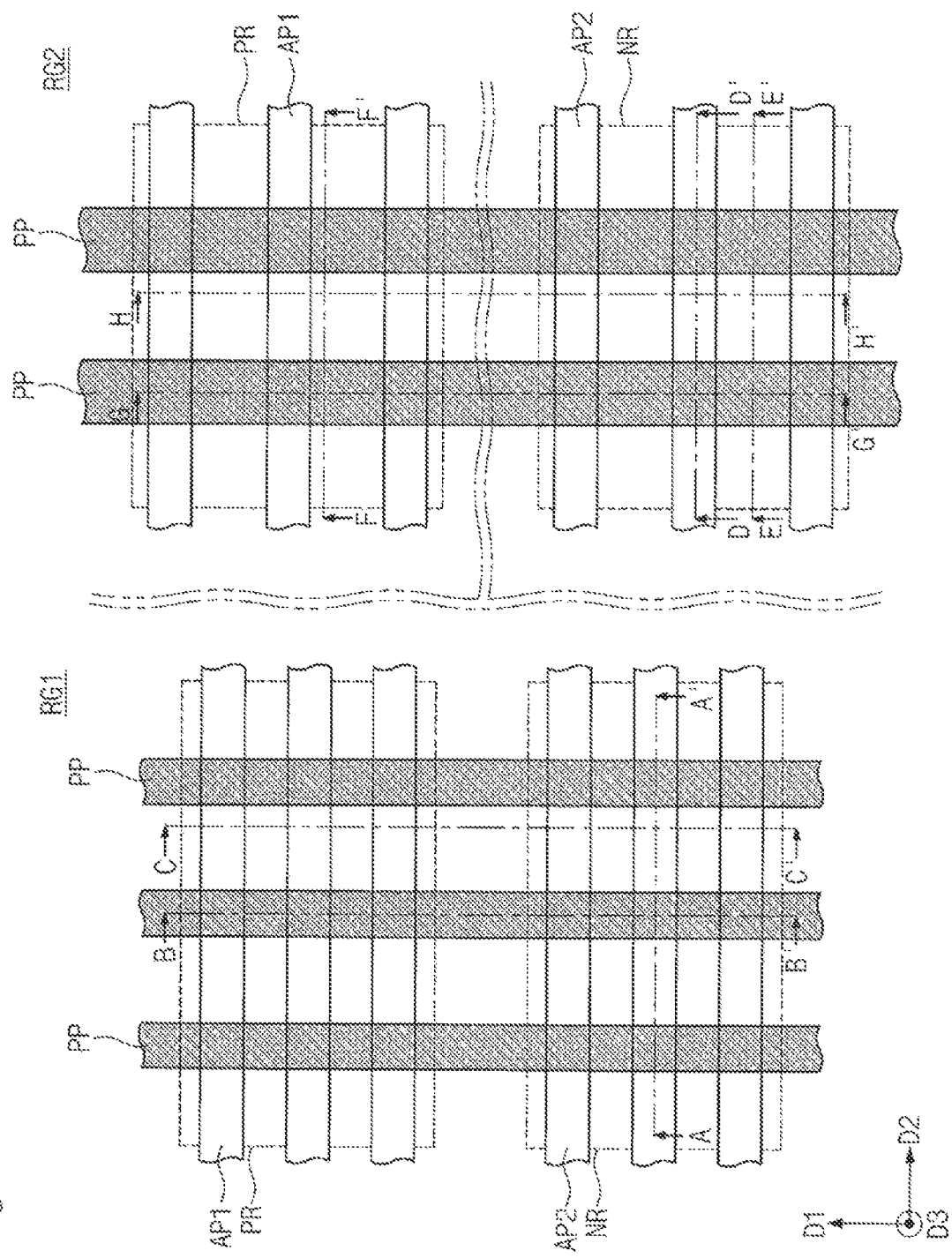
Figure 7A:
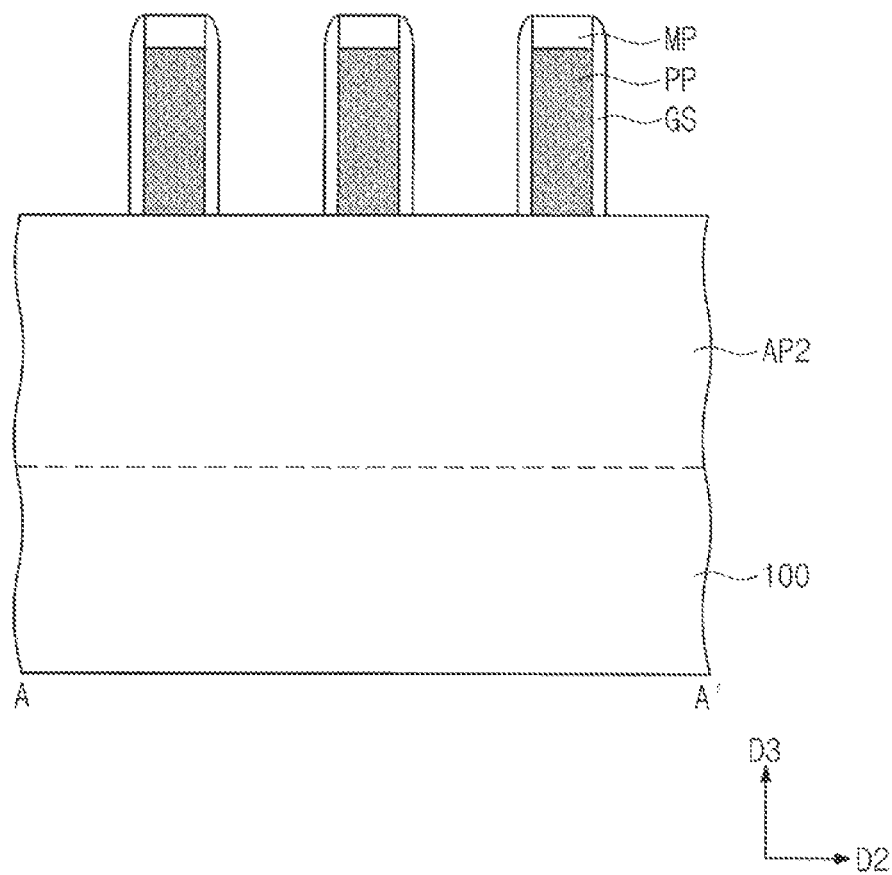
FIGS. 7A, 9A, and 11A are cross-sectional views taken along lines A-A' of FIGS. 6, 8, and 10, respectively.
Figure 7B:
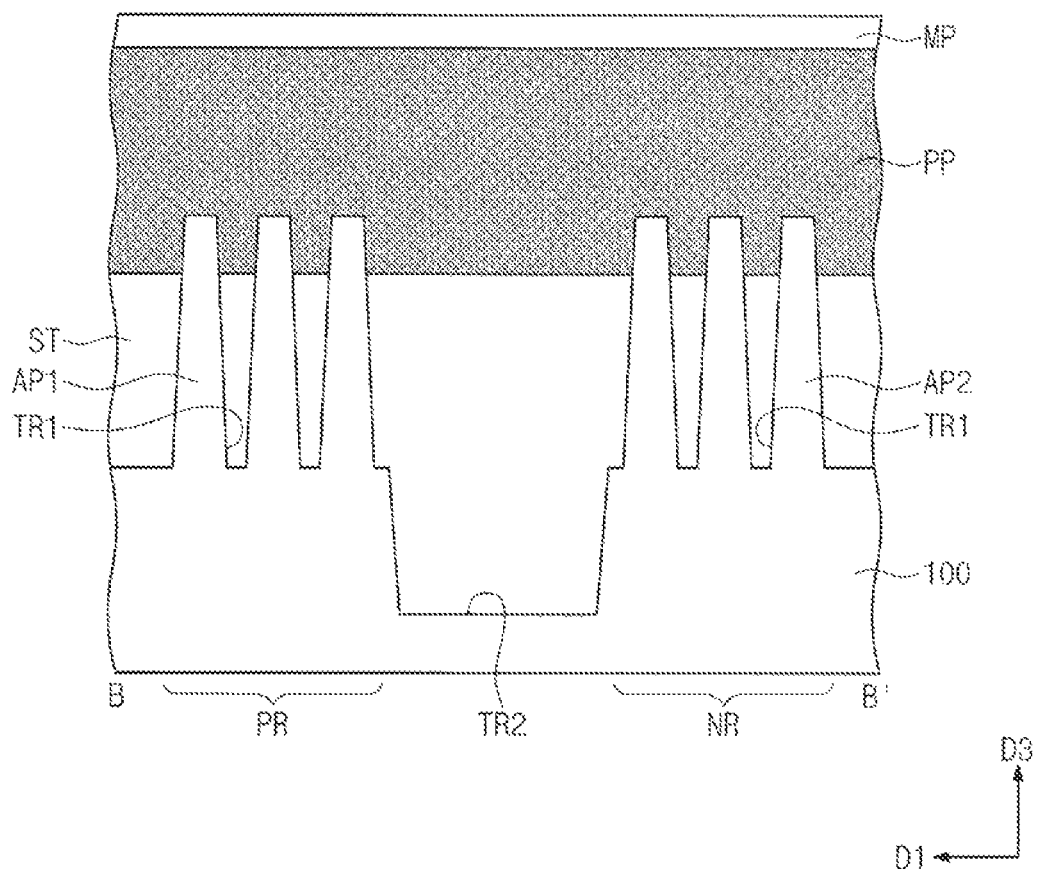
FIGS. 7B, 9B, and 11B are cross-sectional views taken along lines B-B' of FIGS. 6, 8, and 10, respectively.
Figure 7C:
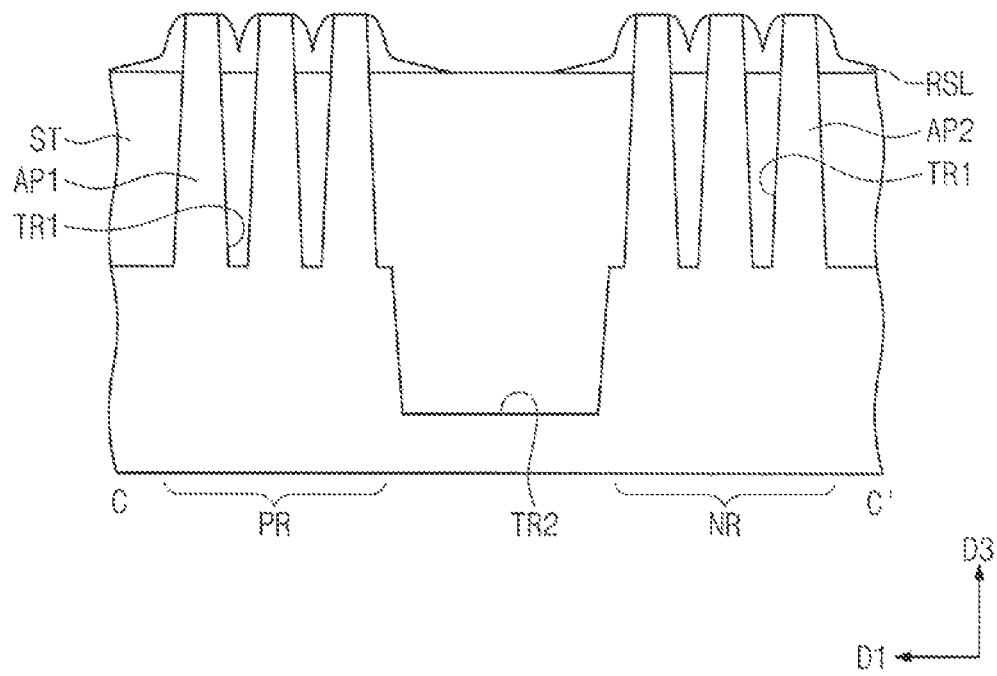
FIGS. 7C, 9C, and 11C are cross-sectional views taken along lines C-C' of FIGS. 6, 8, and 10, respectively.
Figure 7D:
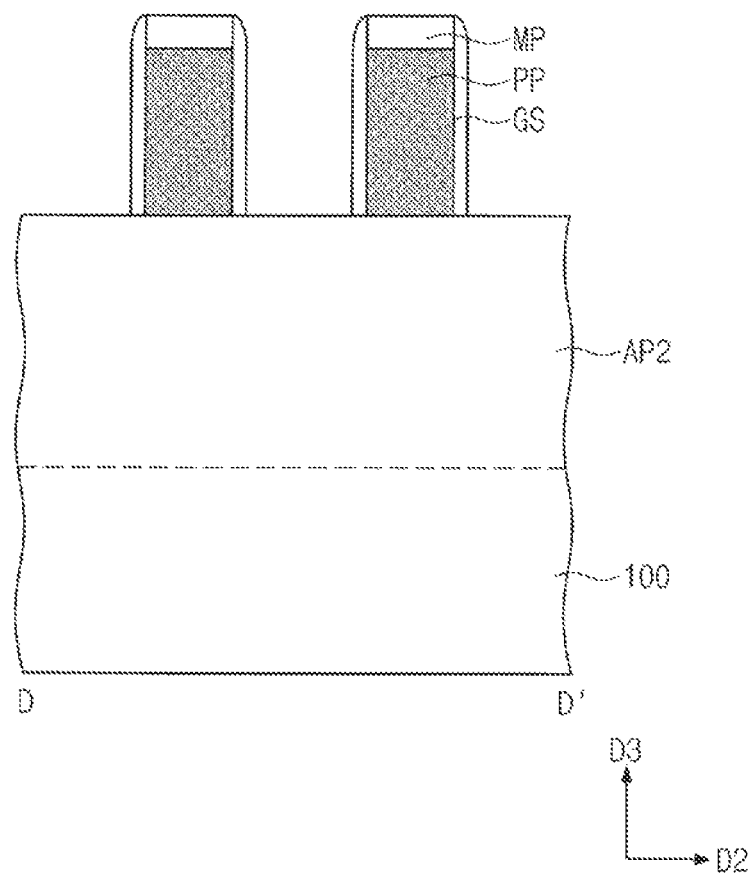
FIGS. 7D, 9D, and 11D are cross-sectional views taken along lines D-D' of FIGS. 6, 8, and 10, respectively.
Figure 7E:
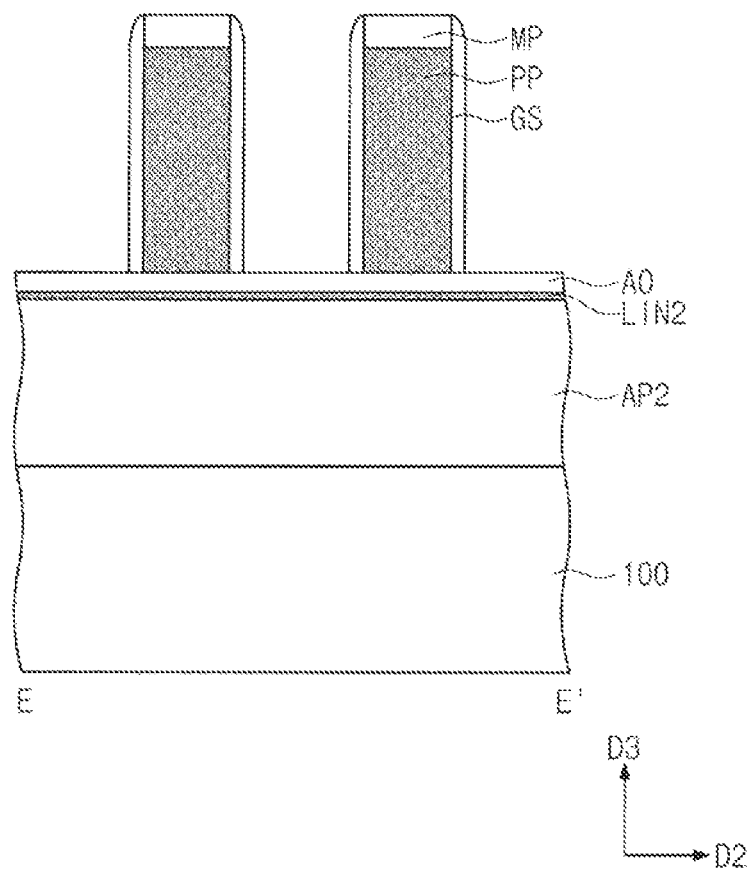
FIGS. 7E, 9E, and 11E are cross-sectional views taken along lines E-E' of FIGS. 6, 8, and 10, respectively.
Figure 7F:
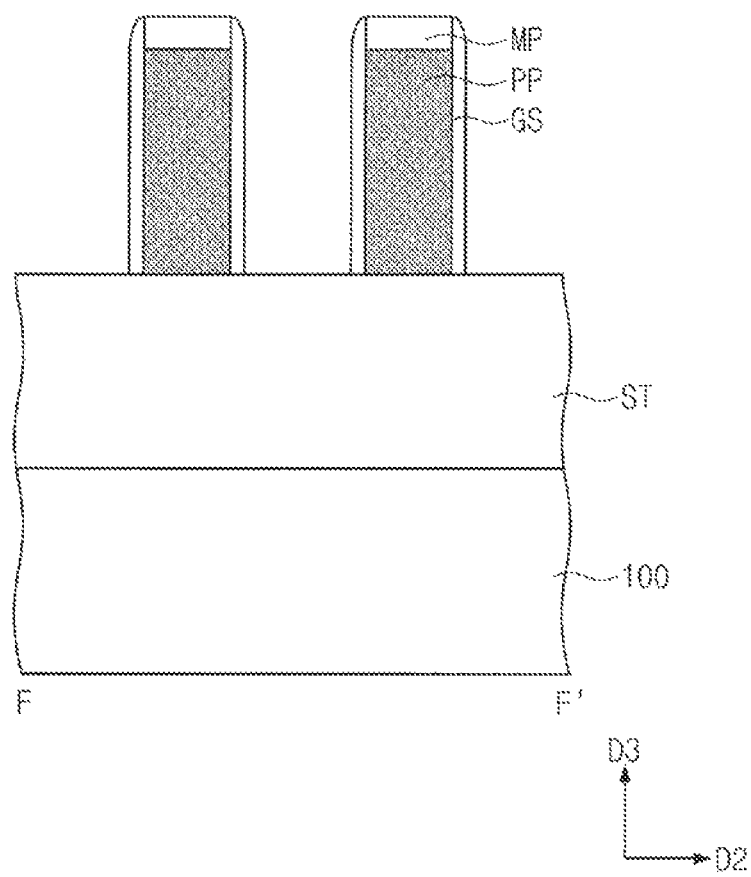
FIGS. 7F, 9F, and 11F are cross-sectional views taken along lines F-F' of FIGS. 6, 8, and 10, respectively.
Figure 7G:
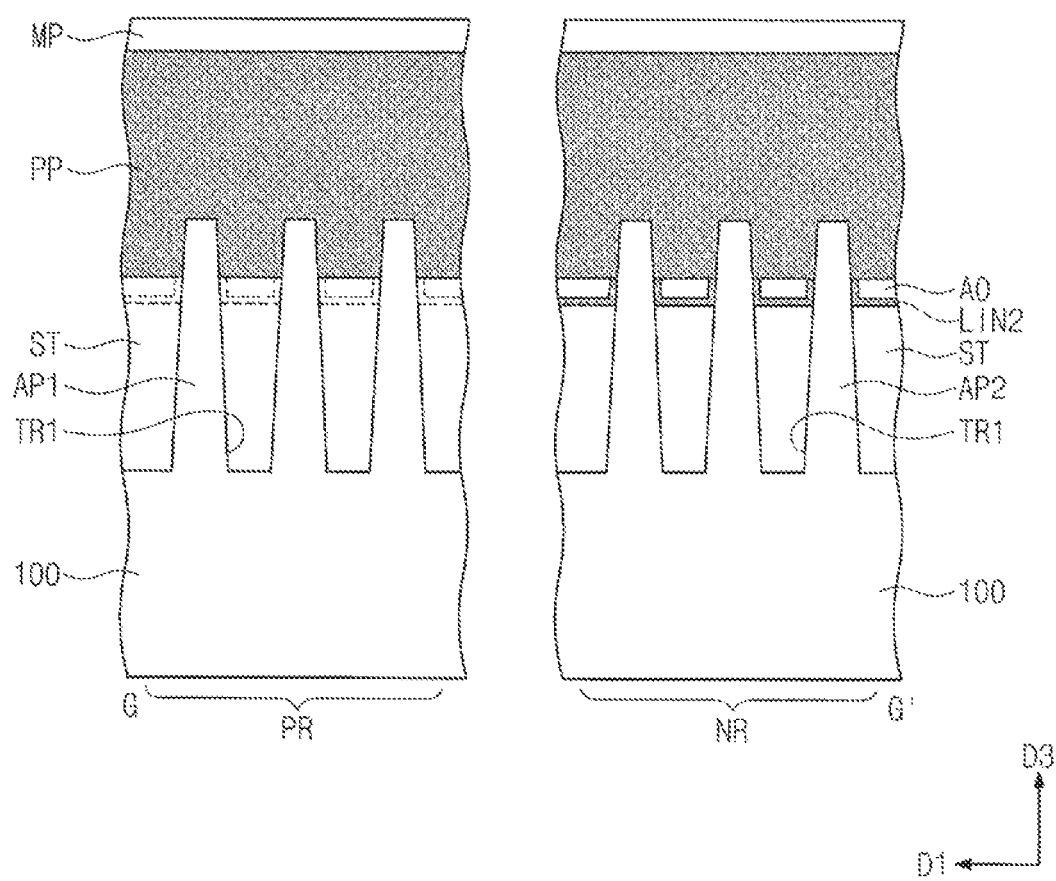
FIGS. 7G, 9G, and 11G are cross-sectional views taken along lines G-G' of FIGS. 6, 8, and 10, respectively.
Figure 7H:
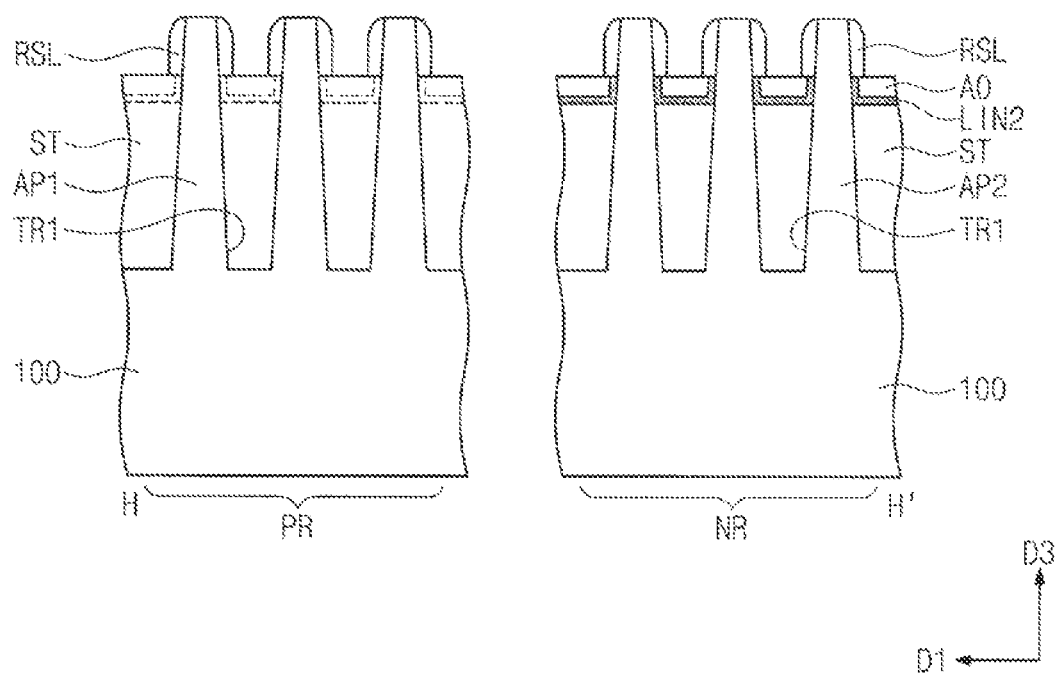
FIGS. 7H, 9H, and 11H are cross-sectional views taken along lines H-H' of FIGS. 6, 8, and 10, respectively.
Figure 8:
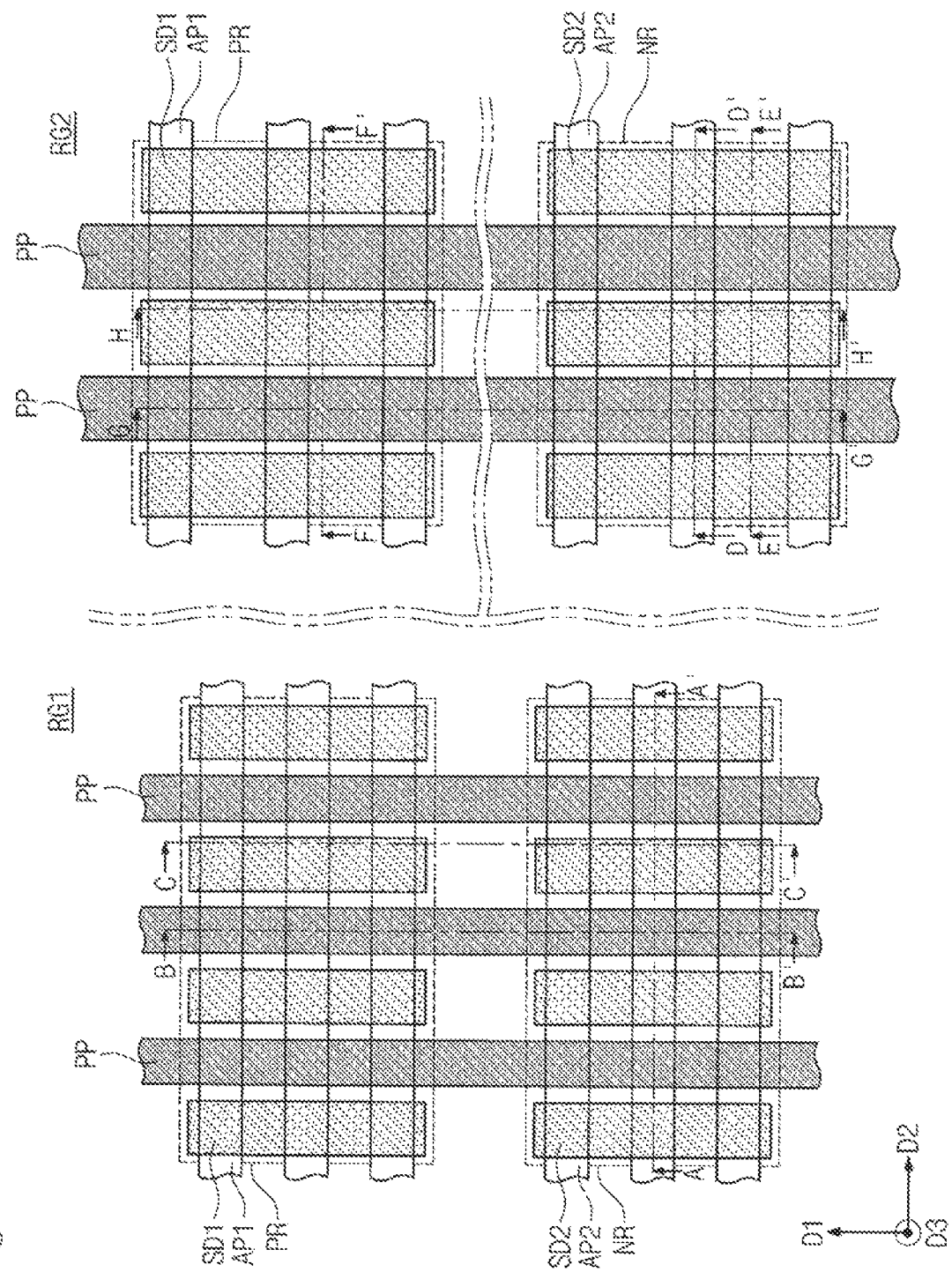
Figure 9A:
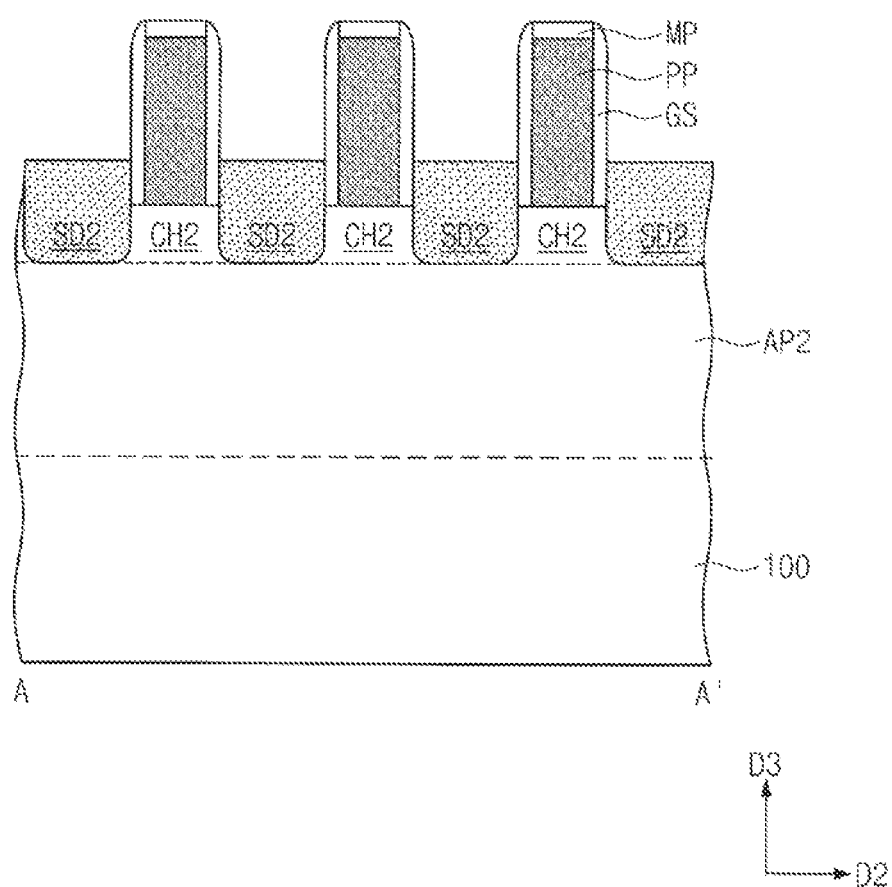
Figure 9B:
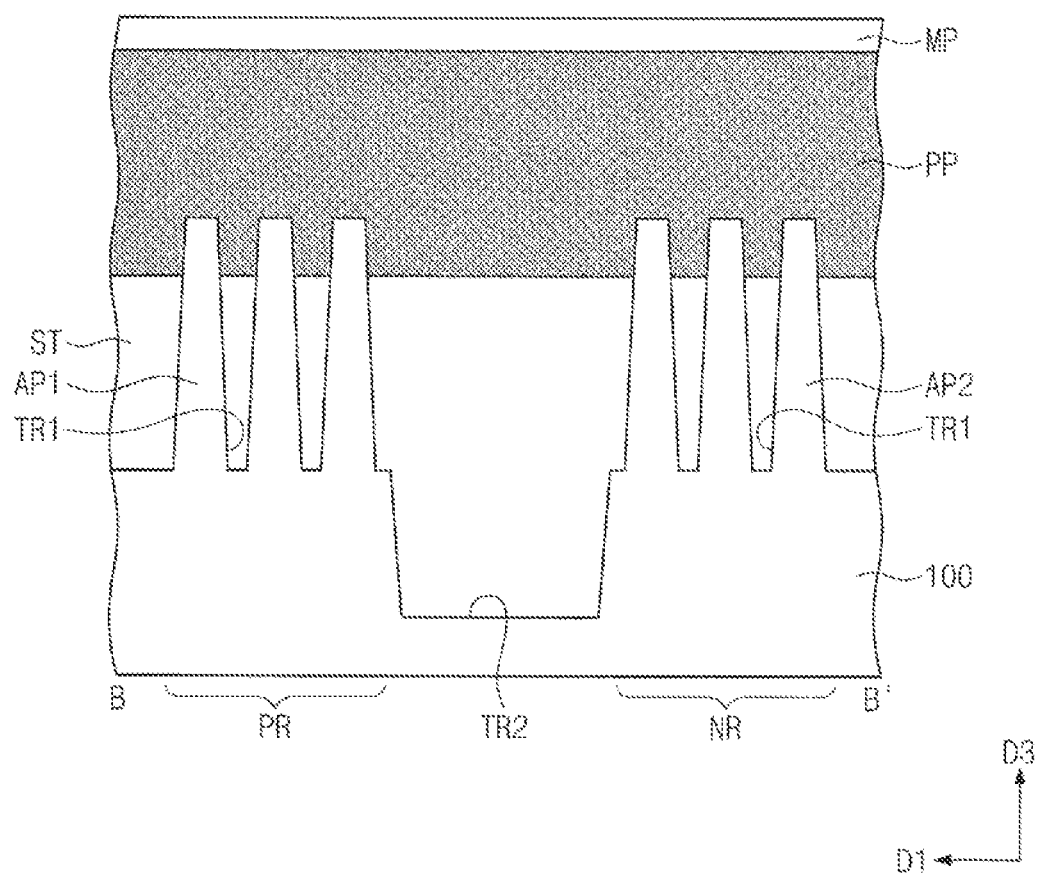
Figure 9C:
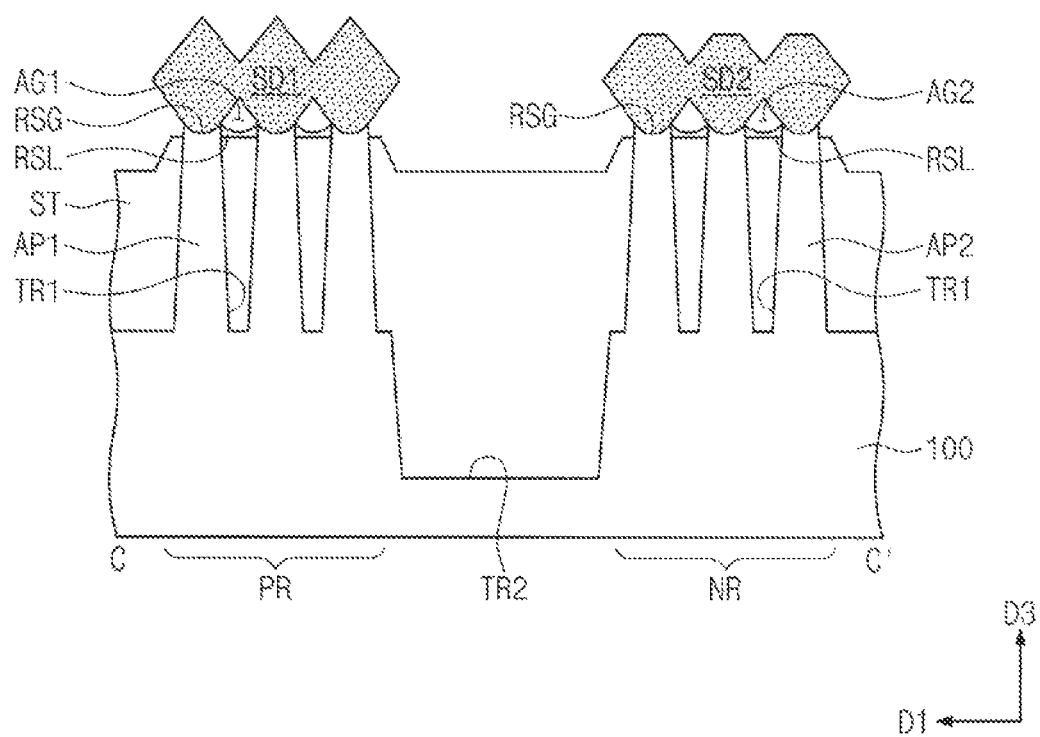
Figure 9D:
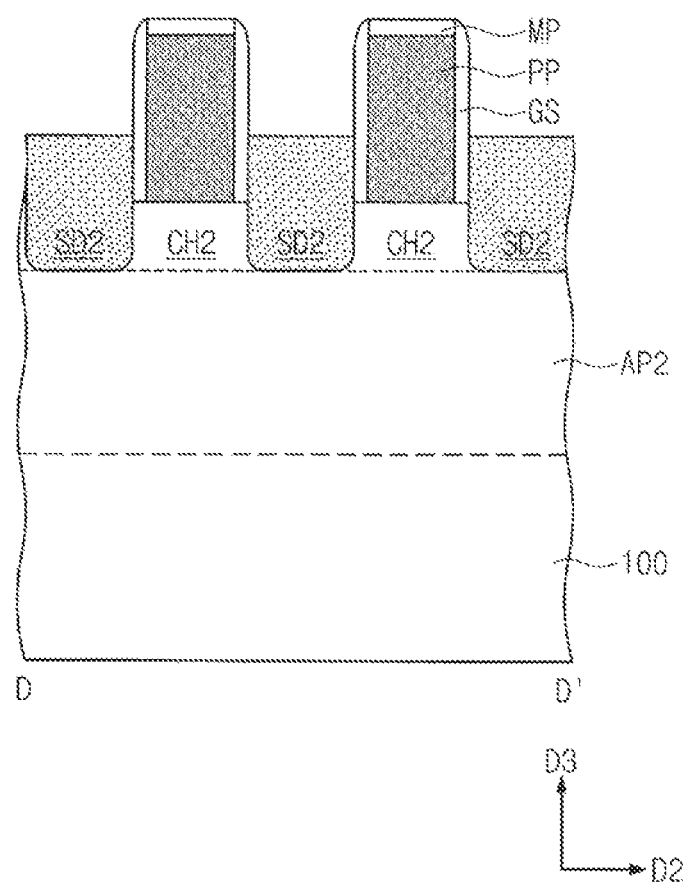
Figure 9E:
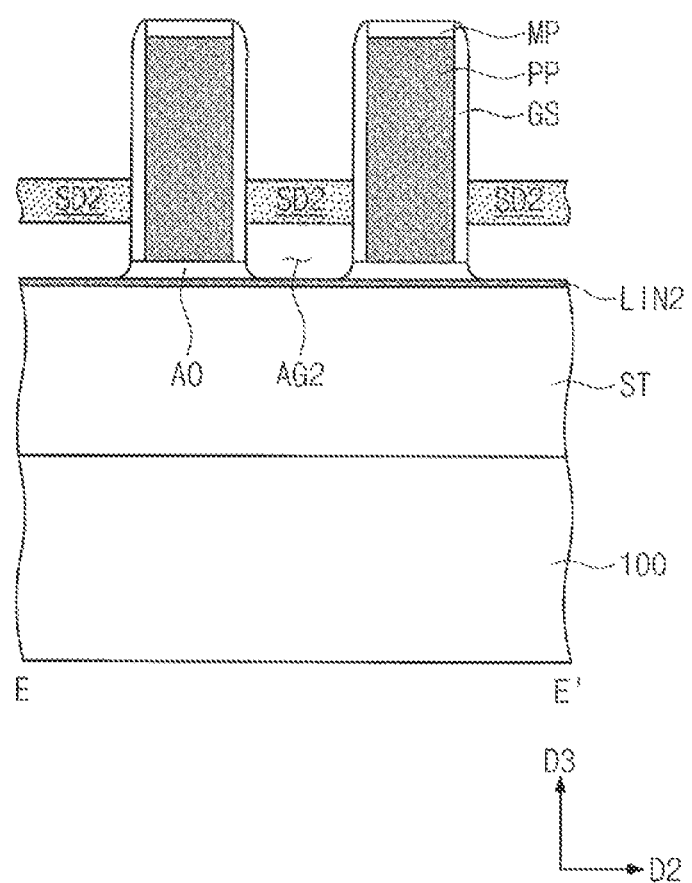
Figure 9F:
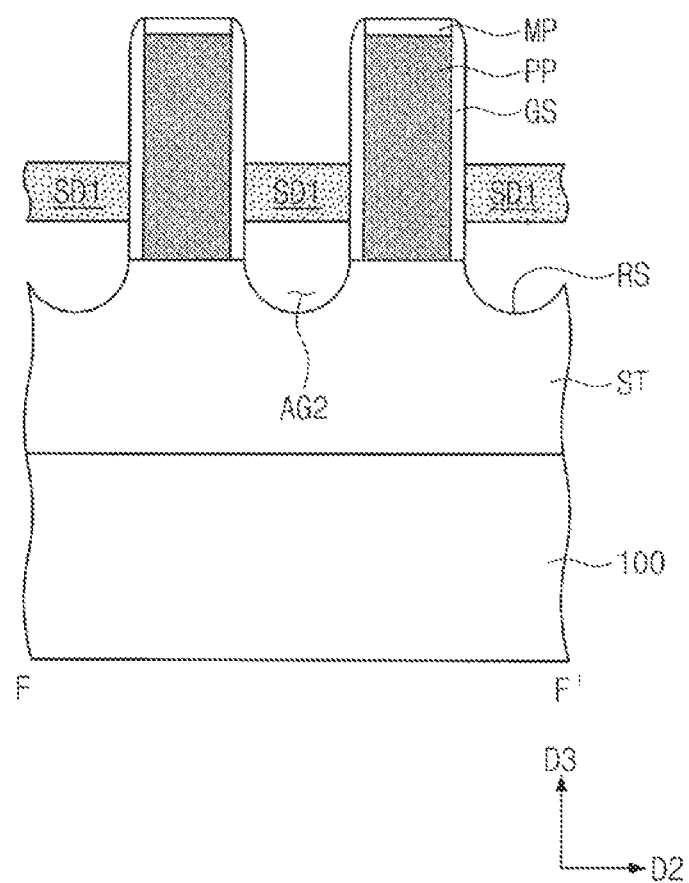
Figure 9G:
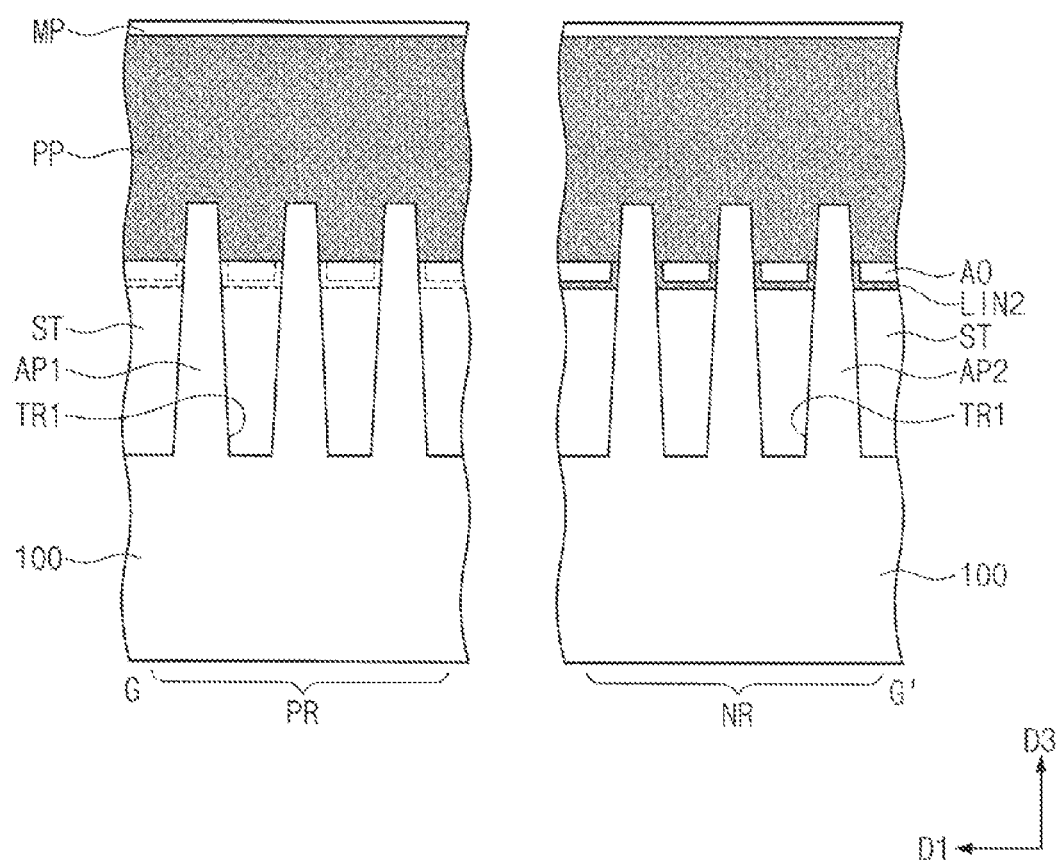
Figure 9H:
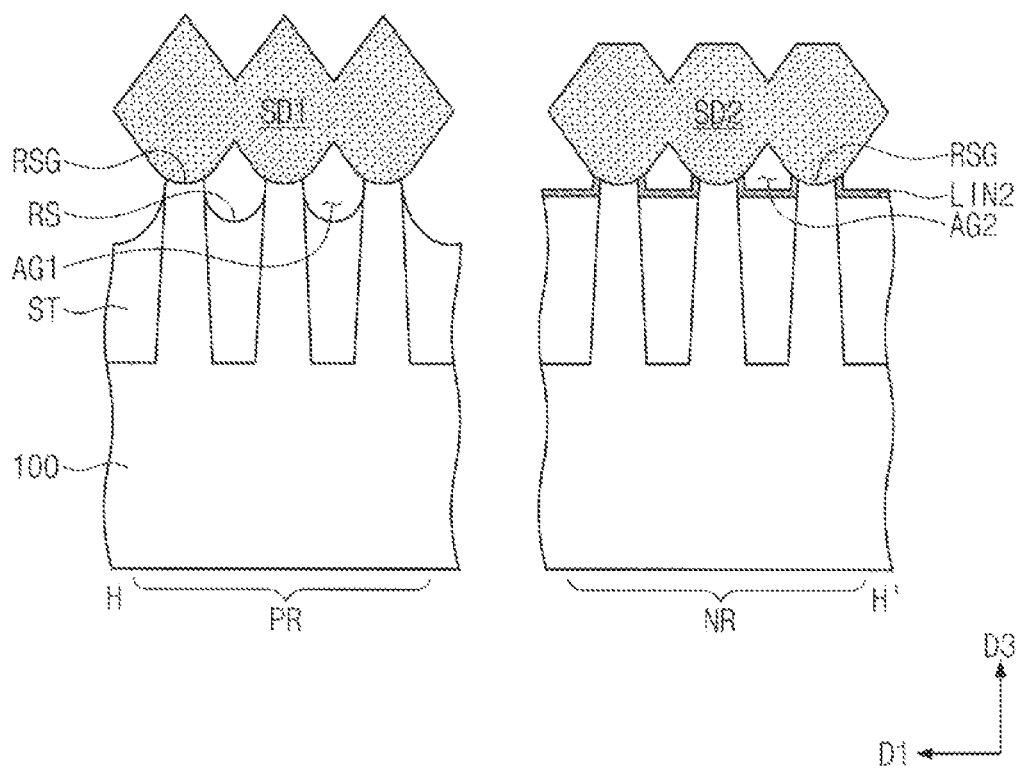
Figure 10:
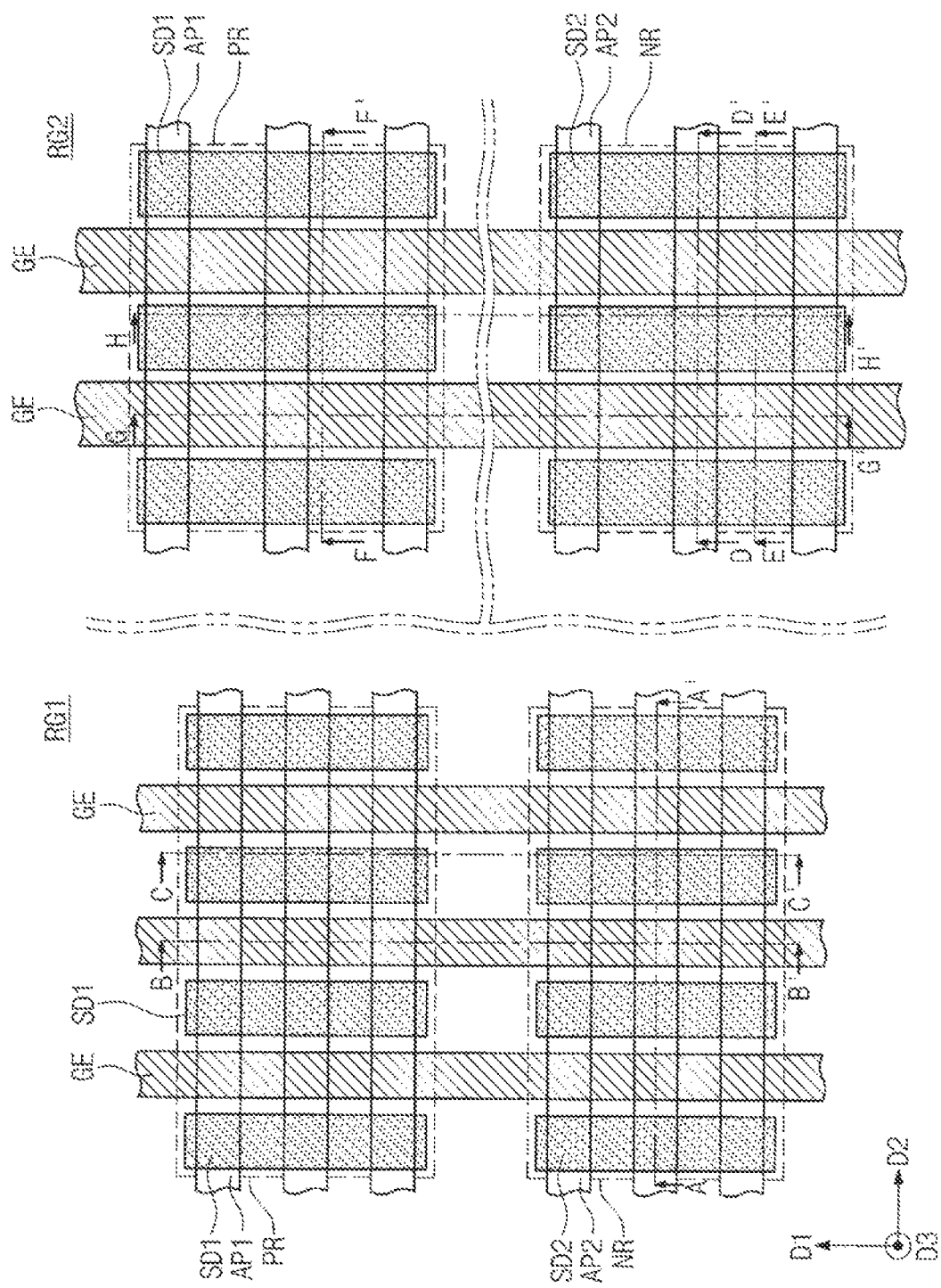
Figure 11A:
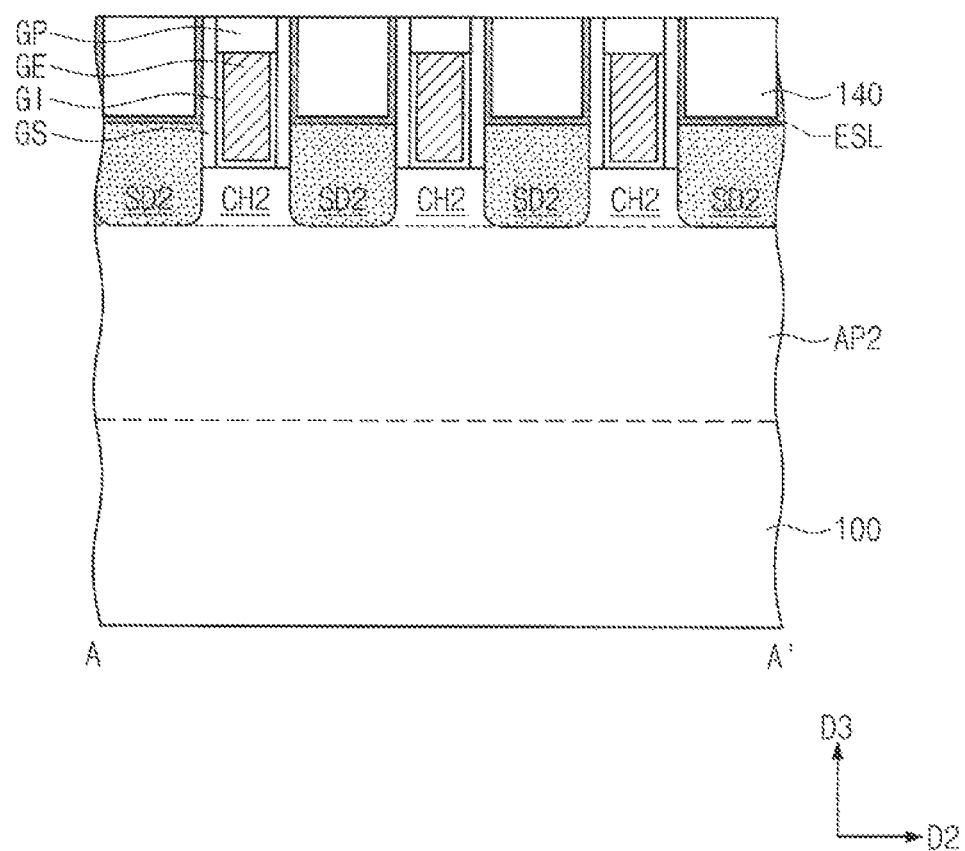
Figure 11B:
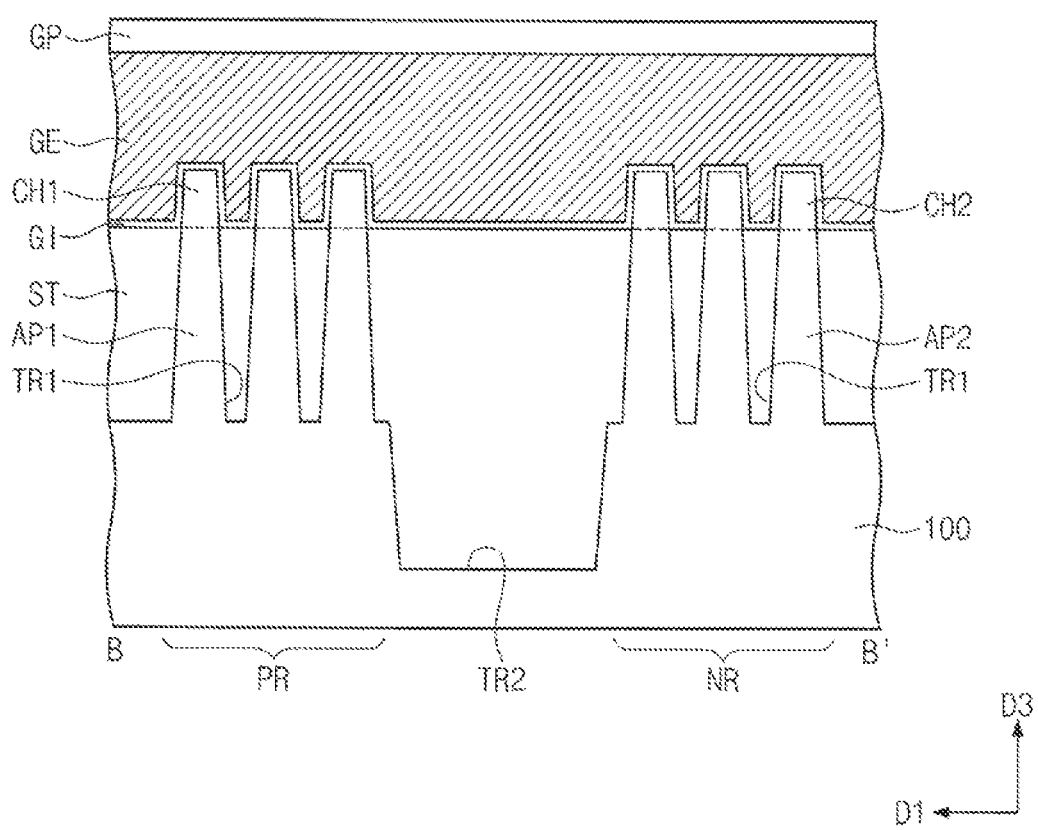
Figure 11C:
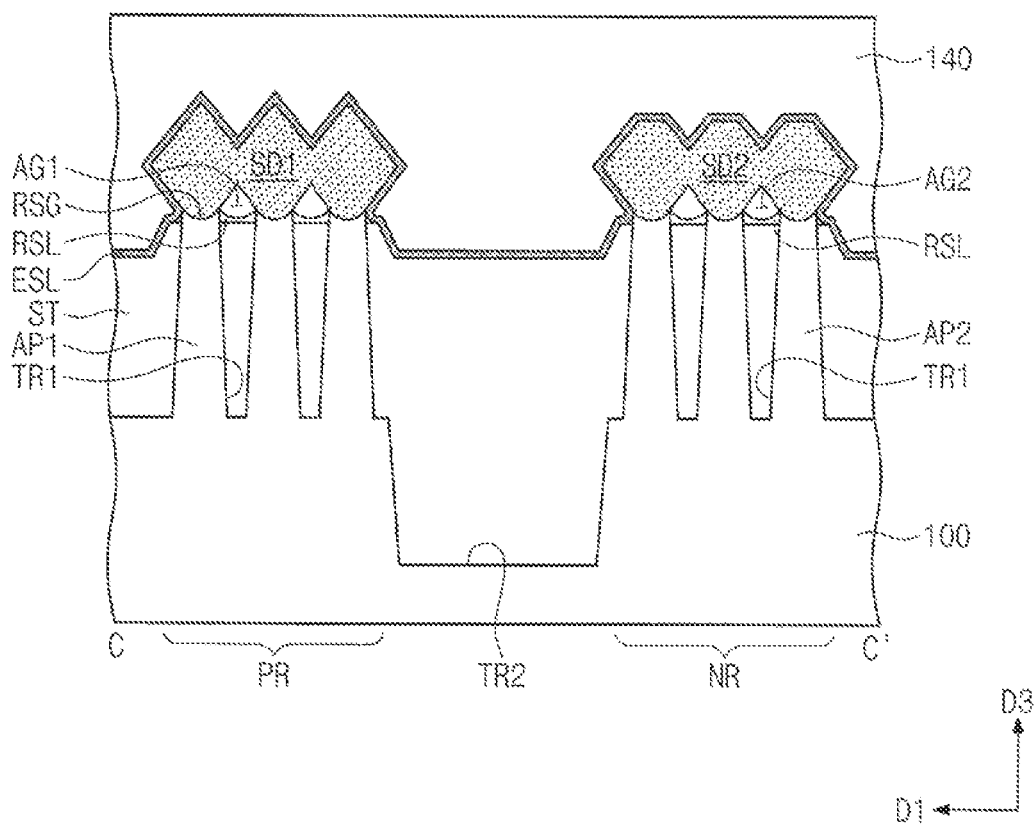
Figure 11D:
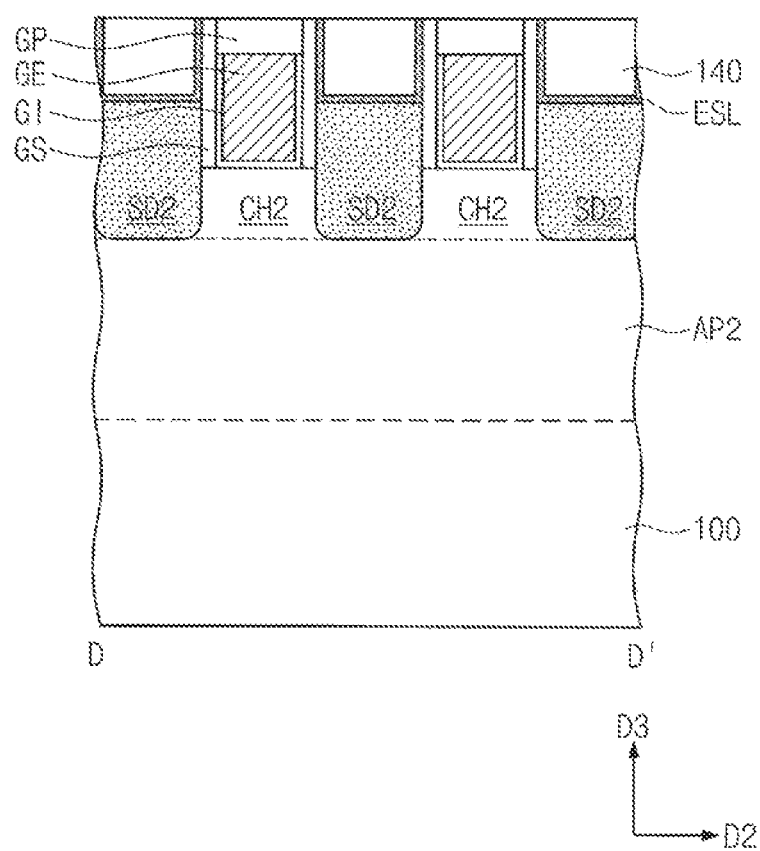
Figure 11E:
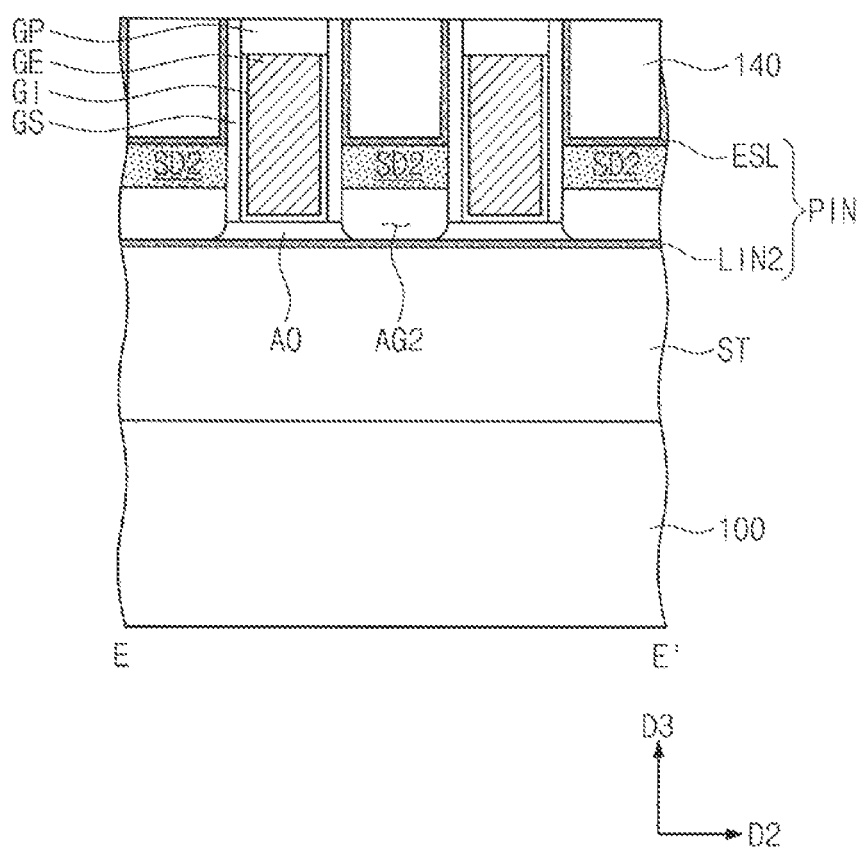
Figure 11F:
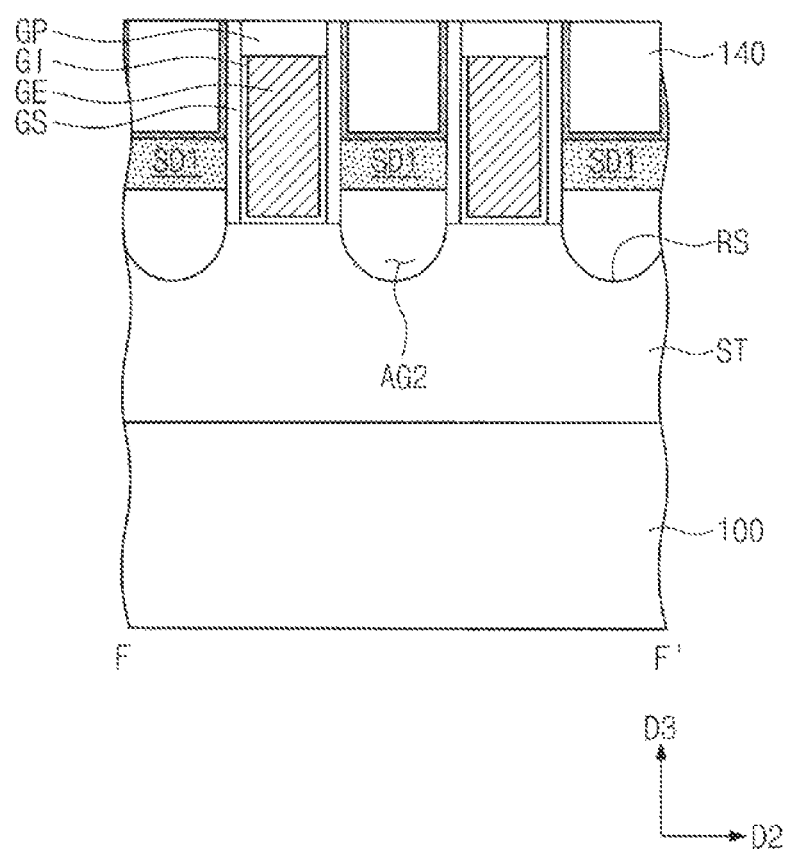
Figure 11G:
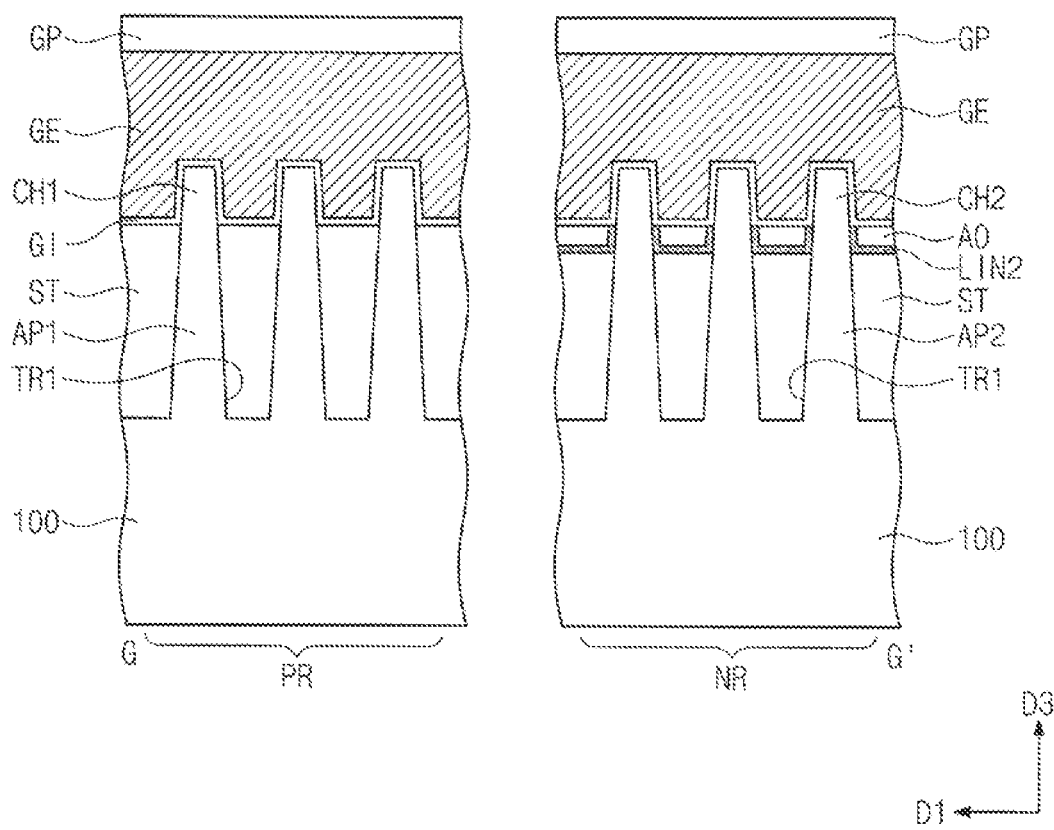
Figure 11H:
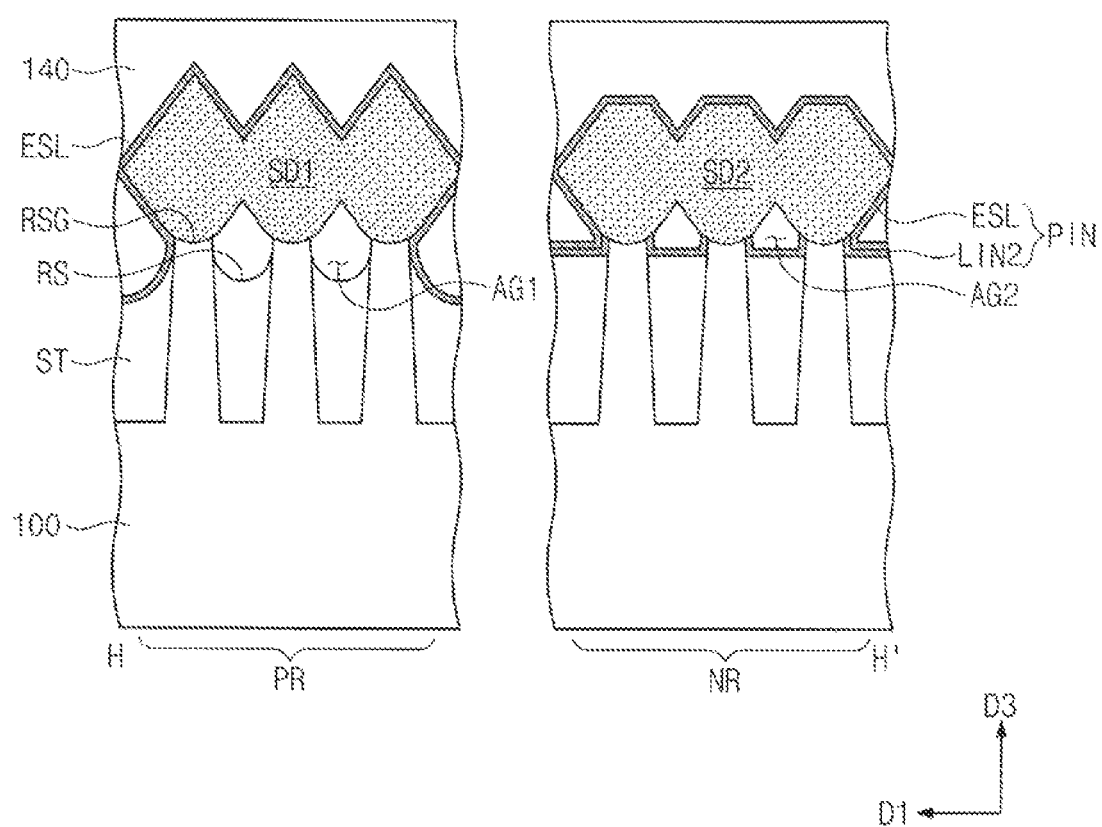

FIGS. 3, 6, 8, and 10 are plan views illustrating a method for manufacturing a semiconductor device according to some embodiments of the inventive concepts. FIGS. 4A and 5A are cross-sectional views taken along a line A-A' of FIG. 3. FIGS. 4B and 5B are cross-sectional views taken along a line B-B' of FIG. 3. FIGS. 4C and 5C are cross-sectional views taken along a line C-C' of FIG. 3. FIGS. 4D and 5D are cross-sectional views taken along a line D-D' of FIG. 3. FIGS. 7A, 9A, and 11A are cross-sectional views taken along lines A-A' of FIGS. 6, 8, and 10, respectively. FIGS. 7B, 9B, and 11B are cross-sectional views taken along lines B-B' of FIGS. 6, 8, and 10, respectively. FIGS. 7C, 9C, and 11C are cross-sectional views taken along lines C-C' of FIGS. 6, 8, and 10, respectively. FIGS. 7D, 9D, and 11D are cross-sectional views taken along lines D-D' of FIGS. 6, 8, and 10, respectively. FIGS. 7E, 9E, and 11E are cross-sectional views taken along lines E-E' of FIGS. 6, 8, and 10, respectively. FIGS. 7F, 9F, and 11F are cross-sectional views taken along lines F-F' of FIGS. 6, 8, and 10, respectively. FIGS. 7G, 9G, and 11G are cross-sectional views taken along lines G-G' of FIGS. 6, 8, and 10, respectively. FIGS. 7H, 9H, and 11H are cross-sectional views taken along lines H-H' of FIGS. 6, 8, and 10, respectively.

Referring to FIGS. 3 and 4A to 4D, a substrate 100 having a first region RG1 and a second region RG2 may be provided. The first region RG1 may be a logic cell region and the second region RG2 may be a peripheral circuit region. The substrate 100 may be patterned to form active patterns AP1 and AP2. In more detail, the formation of the active patterns AP1 and AP2 may include forming mask patterns on the substrate 100, and anisotropically etching the substrate 100 using the mask patterns as etch masks. First trenches TR1 may be formed between the active patterns AP1 and AP2.

A distance (i.e., a pitch), in a first direction D1, between the active patterns AP1 and AP2 on the first region RG1 may be a first distance P1. A distance (i.e., a pitch), in the first direction D1, between the active patterns AP1 and AP2 on the second region RG2 may be a second distance P2. The patterning process may be performed such that the second distance P2 is greater than the first distance P1. In some embodiments, a width of each of the active patterns AP1 and AP2 on the first region RG1 may be substantially equal to a width of each of the active patterns AP1 and AP2 on the second region RG2.

The active patterns AP1 and AP2 on a PMOSFET region PR and an NMOSFET region NR of the first region RG1 may remain, but the active patterns AP1 and AP2 on the other region of the first region RG1 may be removed. In more detail, a mask pattern may be formed to cover the PMOSFET region PR and the NMOSFET region NR of the first region RG1, and an etching process may be performed using the mask pattern as an etch mask. Thus, first active patterns AP1 may remain on the PMOSFET region PR, and second active patterns AP2 may remain on the NMOSFET region NR. The active patterns AP1 and AP2 on a PMOSFET region PR and an NMOSFET region NR of the second region RG2 may also remain, but the active patterns AP1 and AP2 on the other region of the second region RG2 may also be removed.

A second trench TR2 deeper than the first trenches TR1 may be formed between the PMOSFET region PR and the NMOSFET region NR of the first region RG1. In detail, the second trench TR2 may be formed by etching an upper portion of the substrate 100 between the PMOSFET region PR and the NMOSFET region NR of the first region RG1.

A device isolation layer ST may be formed to fill the first and second trenches TR1 and TR2 of the first and second regions RG1 and RG2 of the substrate 100. In more detail, an insulating layer (e.g., a silicon oxide layer) may be formed to completely fill the first and second trenches TR1 and TR2. The insulating layer may completely cover the first and second active patterns AP1 and AP2. The insulating layer may be recessed until upper portions of the first and second active patterns AP1 and AP2 are exposed.

The insulating layer on the first region RG1 may be recessed (or etched) such that a top surface of the device isolation layer ST of the first region RG1 may be disposed at a first level LV1. The insulating layer on the second region RG2 may be recessed (or etched) such that a top surface of the device isolation layer ST of the second region RG2 may be disposed at a second level LV2. The second level LV2 may be lower than the first level LV1. Since the second distance P2 between the active patterns AP1 and AP2 on the second region RG2 is greater than the first distance P1 between the active patterns AP1 and AP2 on the first region RG1, the insulating layer on the second region RG2 may be etched more than the insulating layer on the first region RG1. In other words, an etching amount of the insulating layer on the second region RG2 may be greater than that of the insulating layer on the first region RG1.

A first liner layer LIN1 may be formed to cover the exposed upper portions of the first active patterns AP1 on the first and second regions RG1 and RG2. A second liner layer LIN2 may be formed to cover the exposed upper portions of the second active patterns AP2 on the first and second regions RG1 and RG2. The first and second liner layers LIN1 and LIN2 may be formed of at least one of a silicon nitride layer, a poly-silicon layer, or a silicon oxide layer. The first and second liner layers LIN1 and LIN2 may include the same material or may include different materials from each other. In the present embodiment, the first liner layer LIN1 may include the poly-silicon layer, and the second liner layer LIN2 may include the silicon nitride layer.

The first liner layer LIN1 and the second liner layer LIN2 may be selectively formed on the first active patterns AP1 and the second active patterns AP2, respectively. For example, the first liner layer LIN1 may be formed on the first active patterns AP1 by using a mask selectively opening the PMOSFET regions PR, and the second liner layer LIN2 may be formed on the second active patterns AP2 by using a mask selectively opening the NMOSFET regions NR.

The first and second liner layers LIN1 and LIN2 may prevent the first and second active patterns AP1 and AP2 from leaning. In more detail, the first and second liner layers LIN1 and LIN2 may reduce or minimize stress applied to the first and second active patterns AP1 and AP2.

Referring to FIGS. 3 and 5A to 5D, insulating patterns AO may be formed on the first and second liner layers LIN1 and LIN2 of the second region RG2. In more detail, an additional insulating layer may be formed on an entire top surface of the substrate 100 to completely cover the first and second active patterns AP1 and AP2. The additional insulating layer may be etched until upper portions of the first and second active patterns AP1 and AP2 are exposed. The additional insulating layer on the second region RG2 may be etched to form the insulating patterns AO.

In some embodiments, the etching process may be performed until the first and second liner layers LIN1 and LIN2 on the first region RG1 are removed. In certain embodiments, the etching process may be finished before the first and second liner layers LIN1 and LIN2 on the first region RG1 are completely removed. Thus, the first and second liner layers LIN1 and LIN2 may also remain on the first region RG1 even though not shown in the drawings.

Since the top surface of the device isolation layer ST on the second region RG2 is lower than the top surface of the device isolation layer ST on the first region RG1, portions of the first and second liner layers LIN1 and LIN2 may remain on the second region RG2 after the etching process. The insulating patterns AO on the first and second liner layers LIN1 and LIN2 may also remain. The first and second liner layers LIN1 and LIN2 remaining on the second region RG2 may cover at least portions of sidewalls of the first and second active patterns AP1 and AP2 of the second region RG2.

Referring to FIGS. 6 and 7A to 7H, a thermal treatment process may be performed on the substrate 100. Since the first liner layer LIN1 is formed of the poly-silicon layer in the present embodiment, the first liner layer LIN1 may be oxidized during the thermal treatment process. Thus, a silicon oxide layer may be formed from the first liner layer LIN1 on the second region RG2. The oxidized first liner layer LIN1 and the insulating patterns AO may constitute (or be included in) the device isolation layer ST (see FIGS. 7G and 7H). On the contrary, the second liner layer LIN2 on the second region RG2 may remain after the thermal treatment process.

Sacrificial patterns PP may be formed to intersect the first and second active patterns AP1 and AP2. The sacrificial patterns PP may have line shapes or bar shapes extending in the first direction D1. In more detail, the formation of the sacrificial patterns PP may include forming a sacrificial layer on an entire top surface of the substrate 100, forming hard mask patterns MP on the sacrificial layer, and patterning the sacrificial layer using the hard mask patterns MP as etch masks. The sacrificial layer may include a poly-silicon layer. A width of each of the sacrificial patterns PP on the second region RG2 may be greater than a width of each of the sacrificial patterns PP on the first region RG1.

A pair of gate spacers GS may be formed on both sidewalls of each of the sacrificial patterns PP, respectively. The formation of the gate spacers GS may include conformally forming a spacer layer on an entire top surface of the substrate 100 and anisotropically etching the spacer layer. For example, the spacer layer may include at least one of SiCN, SiCON, or SiN. For another example, the spacer layer may be formed of a multi-layer including at least two of SiCN, SiCON, or SiN.

The spacer layer on the active patterns AP1 and AP2 at both sides of each of the sacrificial patterns PP may be etched by the anisotropic etching process, and thus residual spacer layers RSL may be formed. The residual spacer layers RSL may be formed simultaneously with the gate spacers GS and may include the same material as the gate spacers GS. Since the second distance P2 between the active patterns AP1 and AP2 on the second region RG2 is greater than the first distance P1 between the active patterns AP1 and AP2 on the first region RG1, the etching of the residual spacer layers RSL on the second region RG2 may be more than the etching of the residual spacer layers RSL on the first region RG1. Thus, a thickness of the residual spacer layer RSL on the second region RG2 may be less than a thickness of the residual spacer layer RSL on the first region RG1.

Referring to FIGS. 8 and 9A to 9H, first source/drain regions SD1 may be formed at both sides of each of the sacrificial patterns PP on the PMOSFET regions PR, and second source/drain regions SD2 may be formed at both sides of each of the sacrificial patterns PP on the NMOSFET regions NR.

In more detail, upper portions of the first and second active patterns AP1 and AP2 may be etched using the hard mask patterns MP and the gate spacers GS as etch masks to form recess regions RSG. Since the residual spacer layers RSL on the first region RG1 are relatively thick, portions thereof may remain after the etching process. The residual spacer layers RSL on the first region RG1 may protect the device isolation layer ST disposed thereunder during the etching process.

Since the residual spacer layers RSL on the second region GR2 are relatively thin, the residual spacer layers RSL on the second region RG2 may be completely removed during the etching process. Since the residual spacer layers RSL are completely removed, the device isolation layer ST on the PMOSFET region PR of the second region RG2 may be over-etched during the etching process. Thus, the device isolation layer ST on the PMOSFET region PR of the second region RG2 may have a recessed top surface RS. The second liner layer LIN2 on the NMOSFET region NR of the second region RG2 may protect the device isolation layer ST disposed thereunder during the etching process. Thus, the top surface of the device isolation layer ST on the NMOSFET region NR of the second region RG2 may be disposed at a higher level than the recessed top surface RS of the device isolation layer ST on the PMOSFET region PR of the second region RG2.

First source/drain regions SD1 may be formed by performing a selective epitaxial growth (SEG) process using inner surfaces of the recess regions RSG of the first active patterns AP1 as seed layers. Since the first source/drain regions SD1 are formed, a first channel region CH1 may be defined between a pair of the first source/drain regions SD1. For example, the SEG process may include a chemical vapor deposition (CVD) process or a molecular beam epitaxy (MBE) process. The first source/drain regions SD1 may include a semiconductor element of which a lattice constant is greater than that of a semiconductor element of the substrate 100. For example, the first source/drain regions SD1 may include silicon-germanium (SiGe).

Second source/drain regions SD2 may be formed by performing a SEG process using inner surfaces of the recess regions RSG of the second active patterns AP2 as seed layers. Since the second source/drain regions SD2 are formed, a second channel region CH2 may be defined between a pair of the second source/drain regions SD2. For example, the second source/drain regions SD2 may include silicon.

The first source/drain regions SD1 and the second source/drain regions SD2 may be sequentially formed by different processes from each other. In other words, the first source/drain regions SD1 may not be formed simultaneously with the second source/drain regions SD2.

In the present embodiment, epitaxial patterns may be merged with each other during the SEG process, and thus one first source/drain region SD1 may be formed on the first active patterns AP1 adjacent to each other in the first direction D1. Thus, a first air gap AG1 may be formed between the first source/drain region SD1 and the device isolation layer ST. In the present embodiment, epitaxial patterns may be merged with each other during the SEG process, and thus one second source/drain region SD2 may be formed on the second active patterns AP2 adjacent to each other in the first direction D1. Thus, a second air gap AG2 may be formed between the second source/drain region SD2 and the device isolation layer ST.

Referring to FIGS. 10 and 11A to 11H, an etch stop layer ESL may be conformally formed on an entire top surface of the substrate 100. The etch stop layer ESL may directly cover the first and second source/drain regions SD1 and SD2. The etch stop layer ESL may include a silicon nitride layer. On the NMOSFET region NR of the second region RG2, the etch stop layer ESL and the second liner layer LIN2 may constitute a protective insulating layer PIN.

A first interlayer insulating layer 140 may be formed to cover the first and second source/drain regions SD1 and SD2, the hard mask patterns MP, and the gate spacers GS. For example, the first interlayer insulating layer 140 may include a silicon oxide layer.

The first interlayer insulating layer 140 may be planarized until top surfaces of the sacrificial patterns PP are exposed. The planarization process of the first interlayer insulating layer 140 may be performed using an etch-back process or a chemical mechanical polishing (CMP) process. The hard mask patterns MP may be completely removed during the planarization process. As a result, a top surface of the first interlayer insulating layer 140 may be substantially coplanar with the top surfaces of the sacrificial patterns PP and top surfaces of the gate spacers GS.

The sacrificial patterns PP may be replaced with gate electrodes GE, respectively. In more detail, the exposed sacrificial patterns PP may be selectively removed. The removal of the sacrificial patterns PP may be performed using a wet etching process selectively etching silicon. During the wet etching process, an etching solution may be provided to the first source/drain region SD1 through the first air gap AG1 on the PMOSFET region PR of the second region RG2. However, since the first source/drain region SD1 is formed of silicon-germanium (SiGe), the first source/drain region SD1 may not be etched even though the etching solution is provided to the first source/drain region SD1. On the other hand, since the second source/drain region SD2 is formed of silicon, the second source/drain region SD2 may be etched if the etching solution is provided to the second source/drain region SD2. However, according to some embodiments of the inventive concepts, the second liner layer LIN2 may remain under the sacrificial patterns PP to prevent the etching solution from being provided into the second air gap AG2 of the second region RG2. On the first region RG1, the residual spacer layers RSL may exist between the sacrificial patterns PP and the second source/drain regions SD2 to prevent the second source/drain regions SD2 from being etched during the wet etching process.

A gate dielectric pattern GI, a gate electrode GE, and a gate capping pattern GP may be formed in each of empty spaces formed by the removal of the sacrificial patterns PP. The gate dielectric pattern GI may be conformally formed in the empty space and may not completely fill the empty space. The gate dielectric pattern GI may be formed using an atomic layer deposition (ALD) process or a chemical oxidation process. The gate dielectric pattern GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate electrode layer may be formed to completely fill the empty space, and a planarization process may be performed on the gate electrode layer to form the gate electrode GE. For example, the gate electrode layer may include at least one of a conductive metal nitride (e.g., titanium nitride or tantalum nitride) or a metal material (e.g., titanium, tantalum, tungsten, copper, or aluminum).

Subsequently, upper portions of the gate electrodes GE may be recessed. The gate capping patterns GP may be formed on the recessed gate electrodes GE, respectively. The gate capping patterns GP may completely fill the recessed regions on the gate electrodes GE, respectively. For example, the gate capping patterns GP may include at least one of SiON, SiCN, SiCON, or SiN.

Referring again to FIGS. 1 and 2A to 2H, a second interlayer insulating layer 150 may be formed on the first interlayer insulating layer 140 and the gate capping patterns GP. The second interlayer insulating layer 150 may include a silicon oxide layer or a low-k oxide layer. For example, the low-k oxide layer may include a silicon oxide layer doped with carbon, e.g., SiCOH. The second interlayer insulating layer 150 may be formed by a CVD process.

Contacts AC may be formed to penetrate the second interlayer insulating layer 150 and the first interlayer insulating layer 140. The contacts AC may be connected to the first and second source/drain regions SD1 and SD2. In more detail, the formation of the contacts AC may include forming contact holes penetrating the second interlayer insulating layer 150 and the first interlayer insulating layer 140, and forming a conductive layer filling the contact holes. For example, the conductive layer may include at least one of aluminum, copper, tungsten, molybdenum, or cobalt.

Subsequently, even though not shown in the drawings, an additional interlayer insulating layer and metal interconnection lines may be formed on the second interlayer insulating layer 150.

Figure 12:
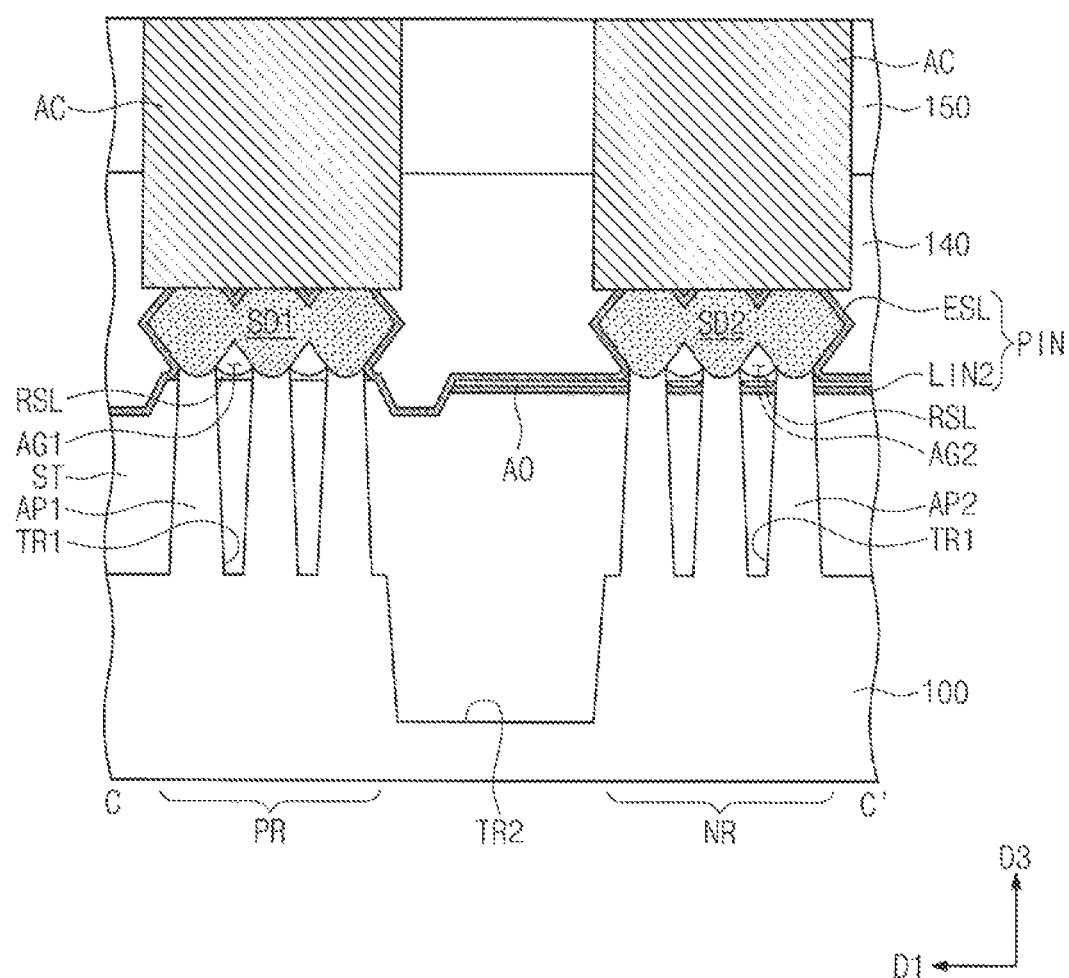
FIG. 12 is a cross-sectional view taken along the line C-C' of FIG. 1 to illustrate a semiconductor device according to some embodiments of the inventive concepts.

FIG. 12 is a cross-sectional view taken along the line C-C' of FIG. 1 to illustrate a semiconductor device according to some embodiments of the inventive concepts. In the present embodiment, the descriptions to the same technical features as in the embodiment of FIGS. 1 and 2A to 2H will be omitted for the purpose of ease and convenience in explanation. In other words, differences between the present embodiment and the embodiment of FIGS. 1 and 2A to 2H will be mainly described hereinafter.

Figure 2H:
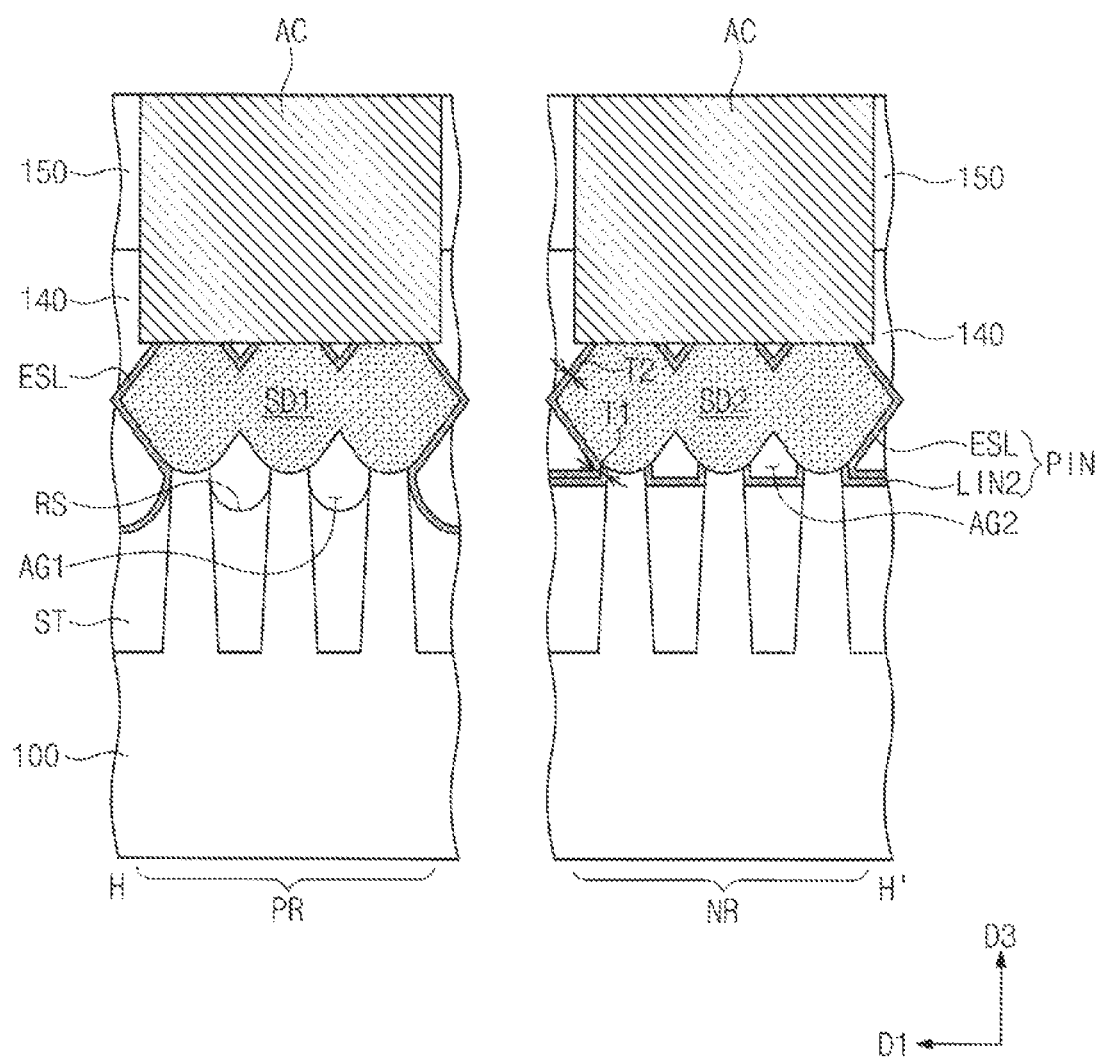

Referring to FIGS. 1, 2H, and 12, the second liner layer LIN2 may be provided on the NMOSFET region NR of the first region RG1 as well as the NMOSFET region NR of the second region RG2. The second liner layer LIN2 of the NMOSFET region NR of the first region RG1 may be disposed between the device isolation layer ST and the residual spacer layer RSL. The second liner layer LIN2 and the etch stop layer ESL on the NMOSFET region NR of the first region RG1 may constitute a protective insulating layer PIN of the first region RG1. A level of a bottom surface of the second liner layer LIN2 on the NMOSFET region NR of the first region RG1 may be higher than a level of a bottom surface of the second liner layer LIN2 on the NMOSFET region NR of the second region RG2.

Figure 13:
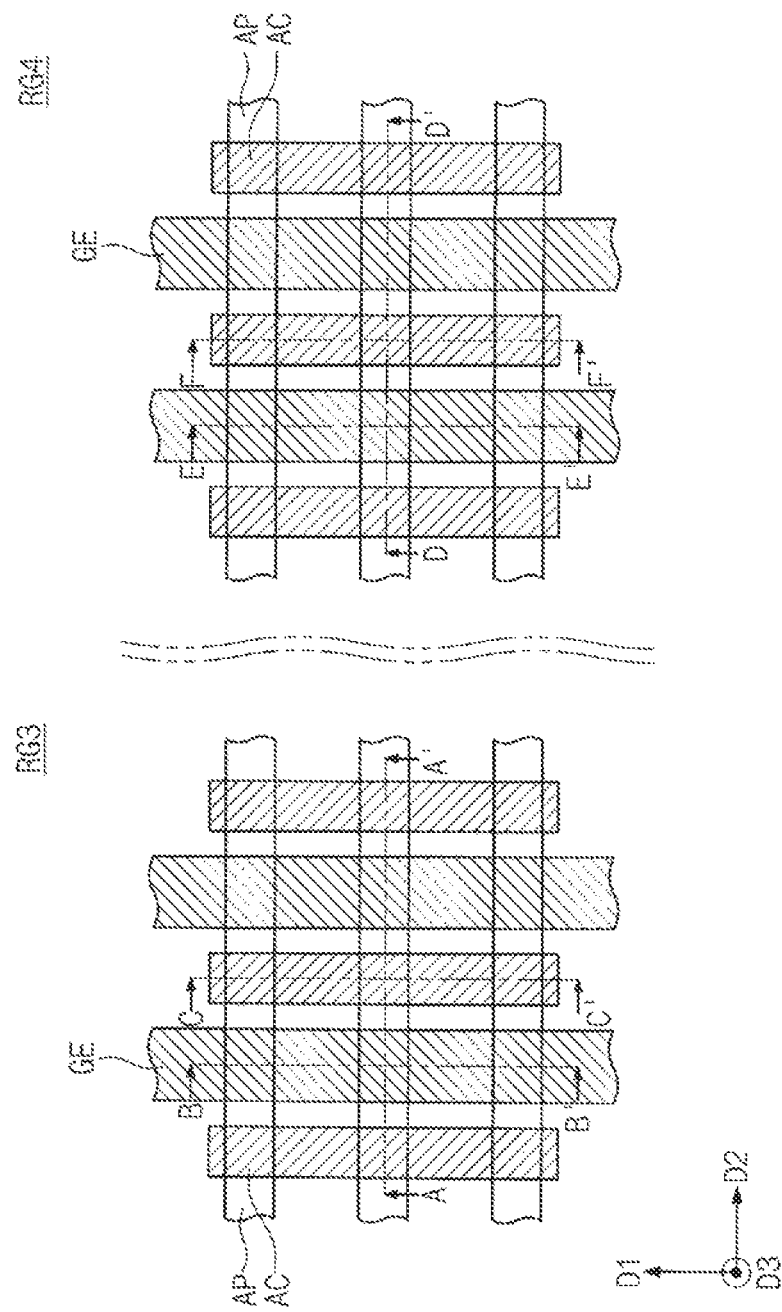
FIG. 13 is a plan view illustrating a semiconductor device according to some embodiments of the inventive concepts.
Figure 14A:
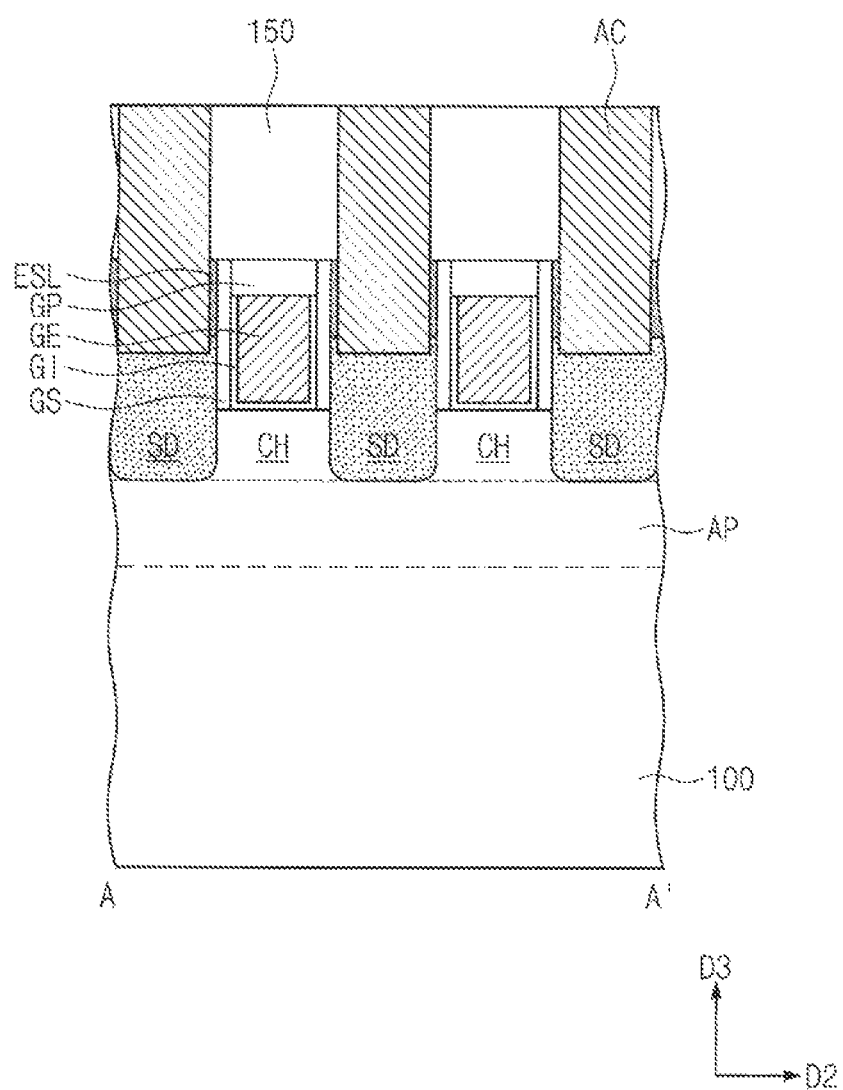
FIGS. 14A to 14F are cross-sectional views taken along lines A-A', B-B', C-C', D-D', E-E', and F-F' of FIG. 13, respectively.
Figure 14B:
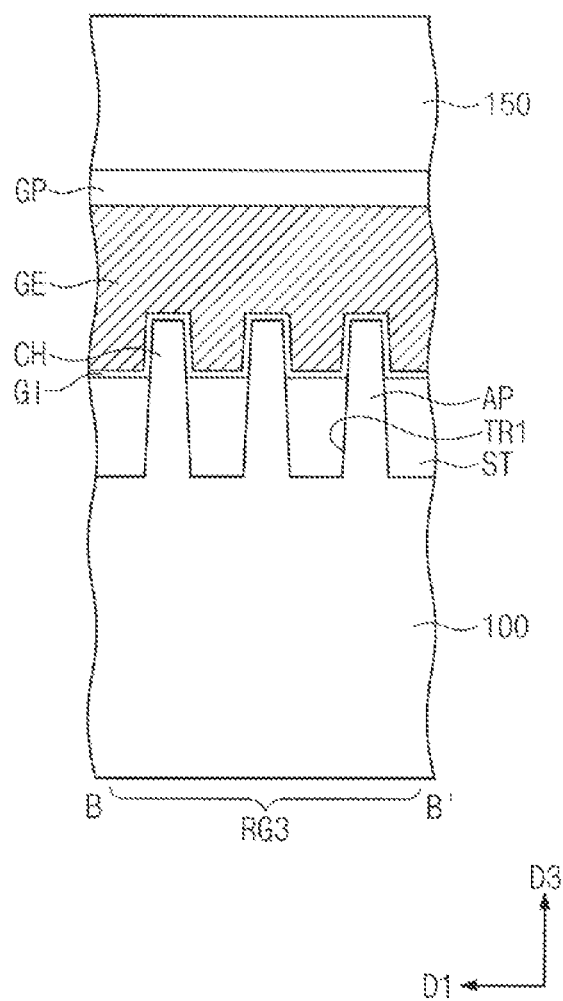
Figure 14C:
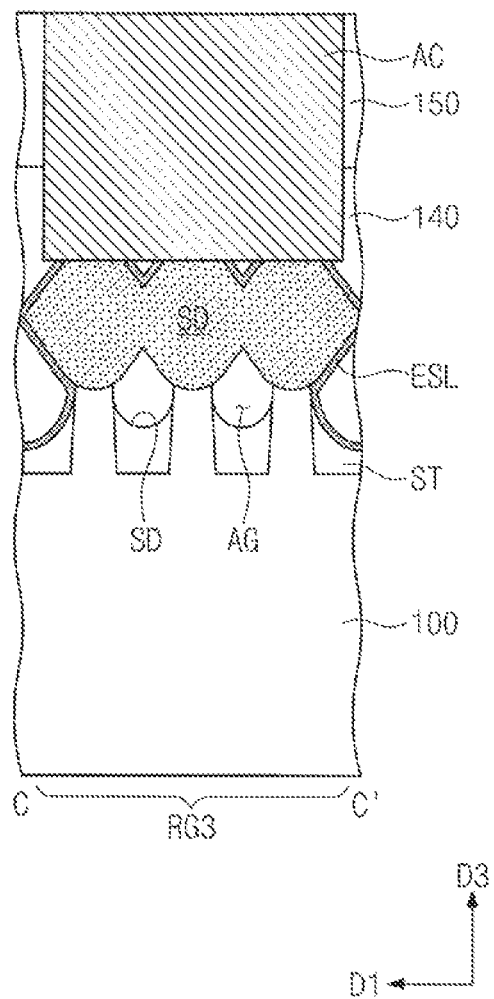
Figure 14D:
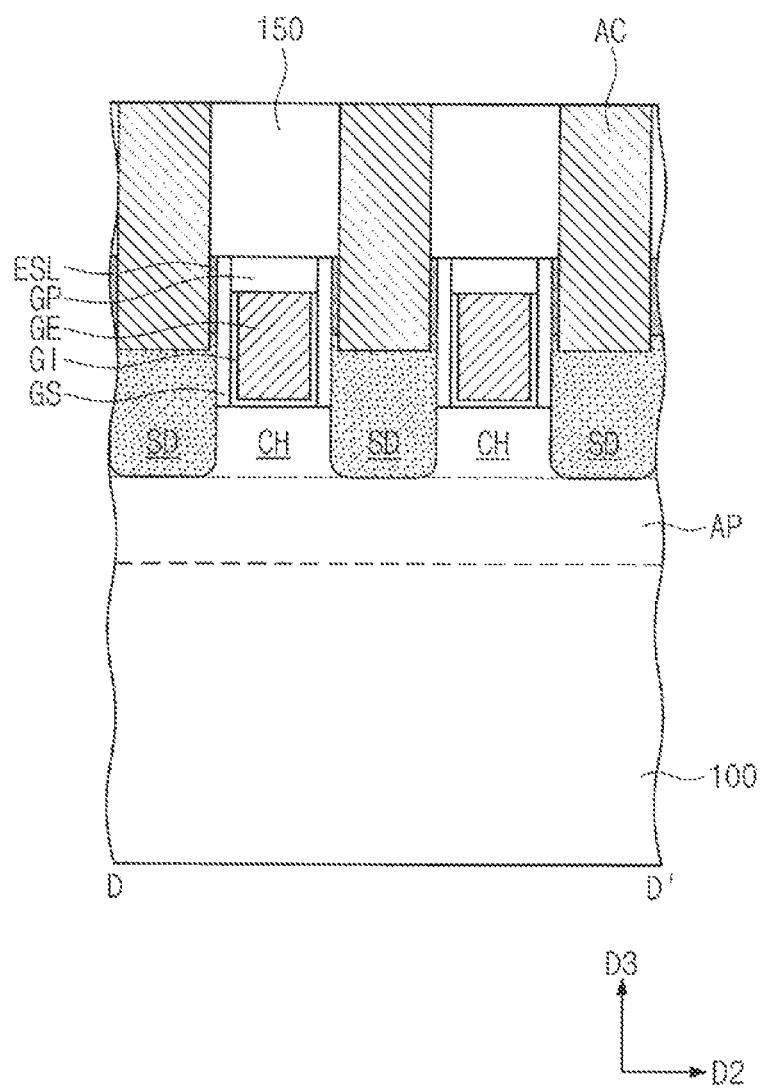
Figure 14E:
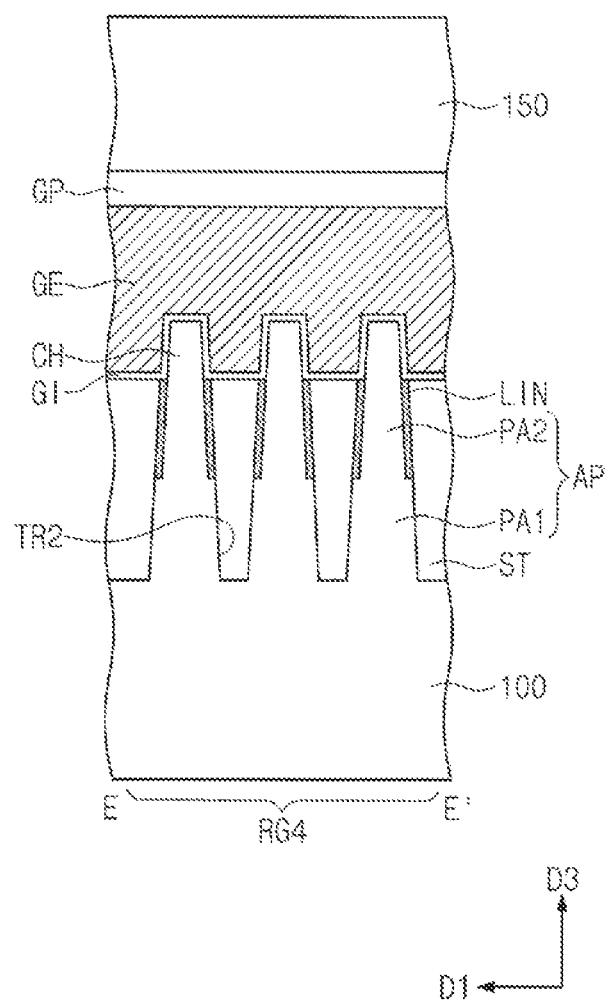
Figure 14F:
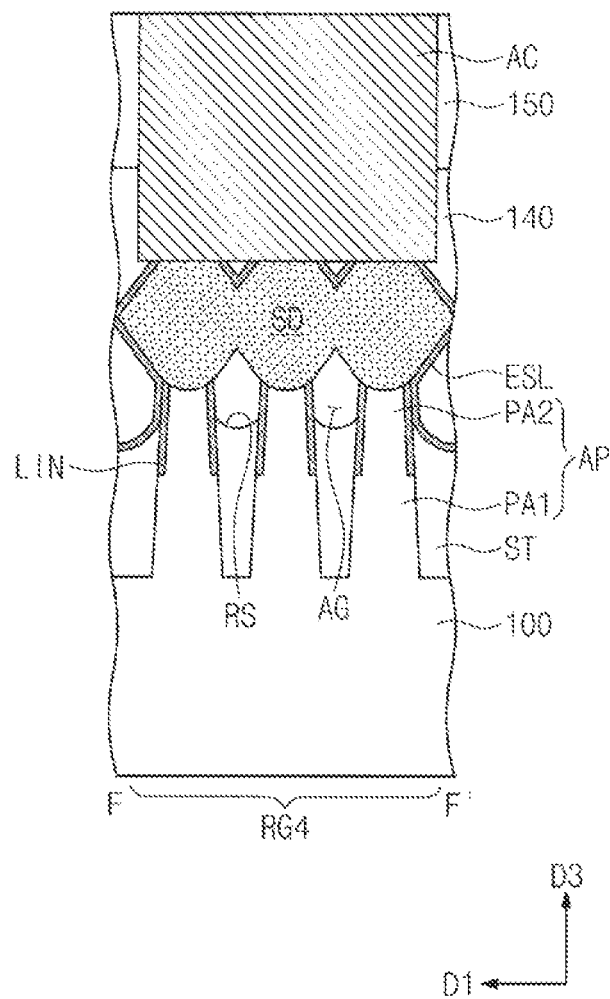
Figure 17A:
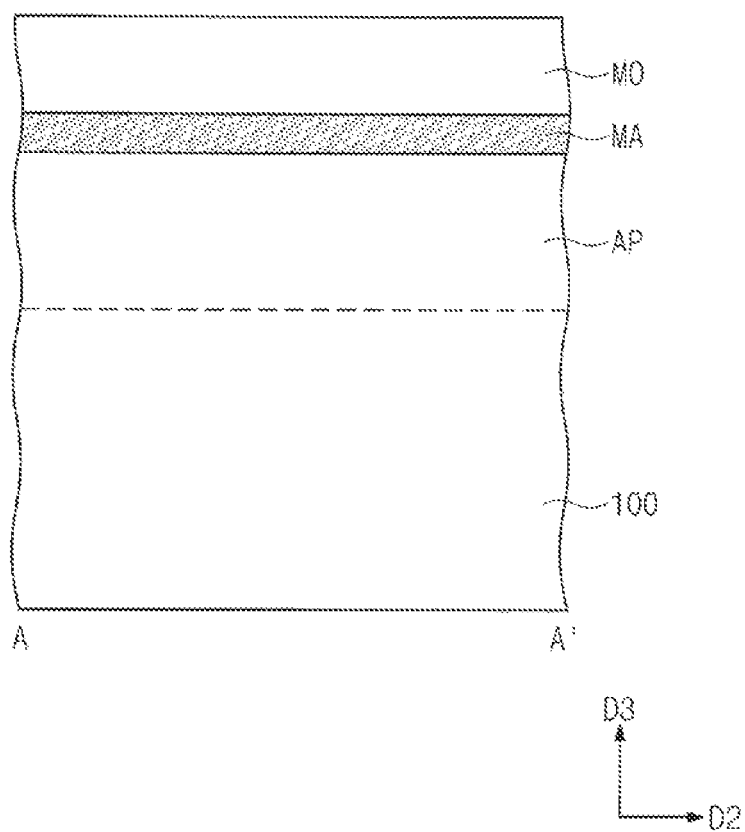
Figure 17B:
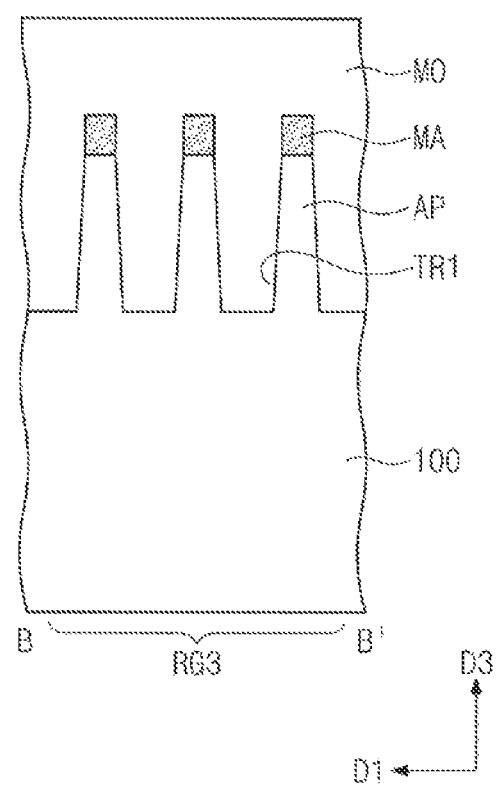
Figure 17C:
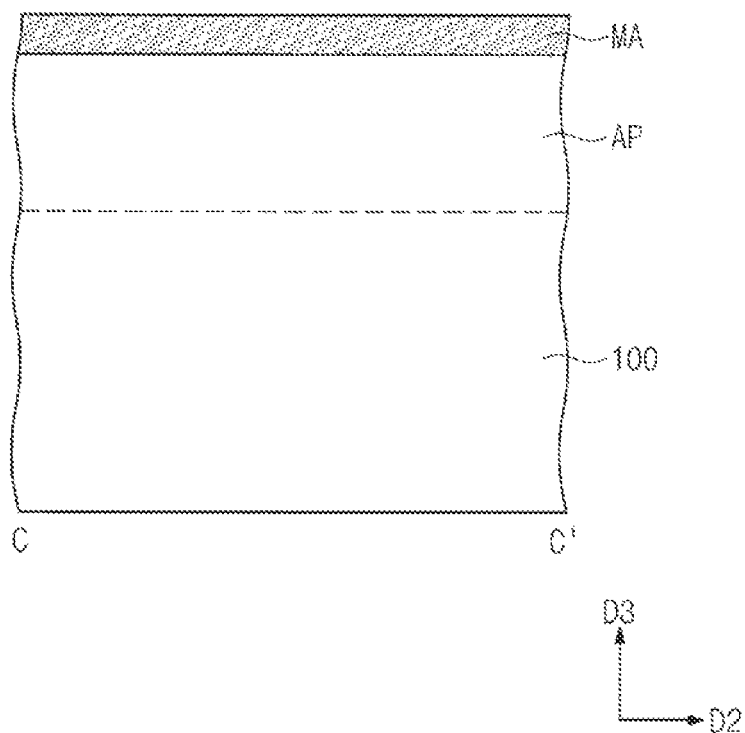
Figure 17D:
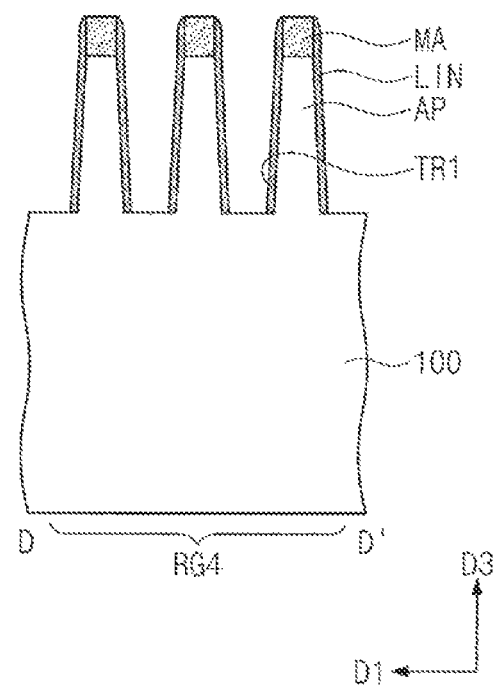
Figure 18A:
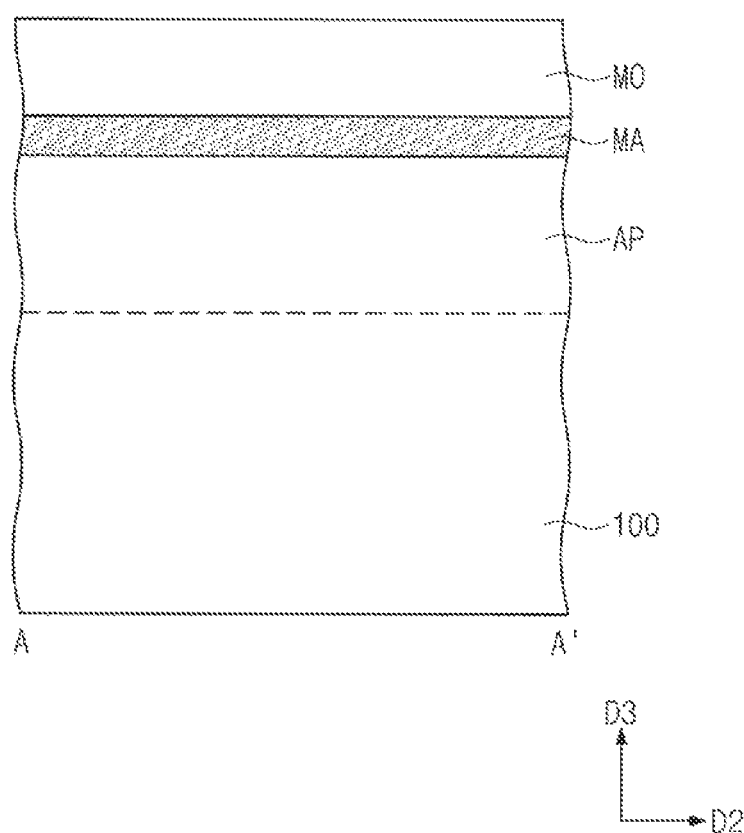
Figure 18B:
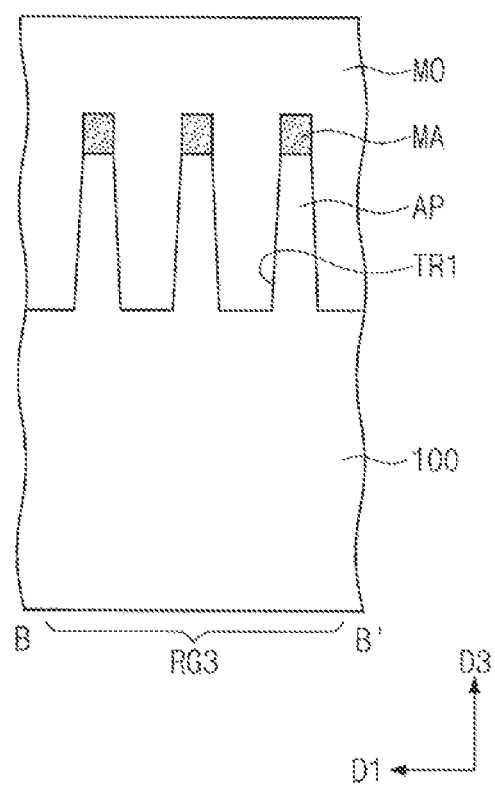
Figure 19A:
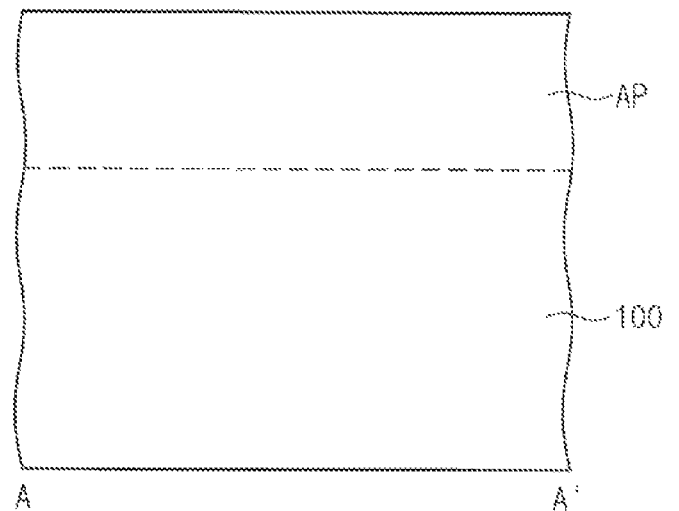
Figure 19B:
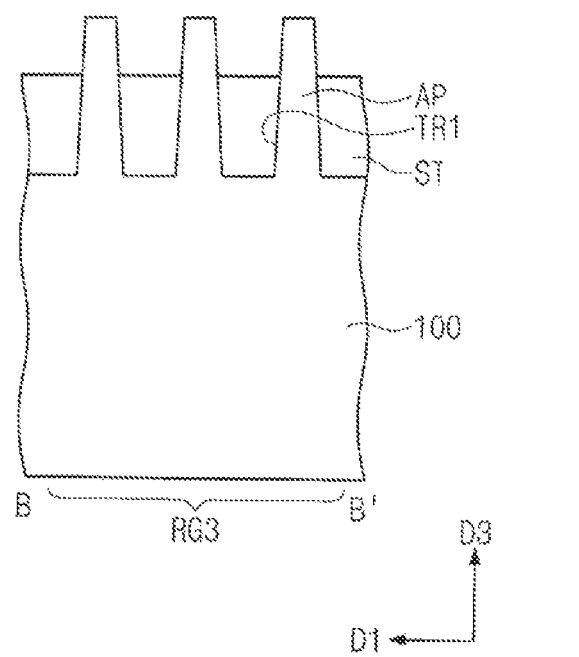

FIG. 13 is a plan view illustrating a semiconductor device according to some embodiments of the inventive concepts. FIGS. 14A to 14F are cross-sectional views taken along lines A-A', B-B', C-C', D-D', E-E', and F-F' of FIG. 13, respectively. In the present embodiment, the descriptions to the same technical features as in the embodiment of FIGS. 1 and 2A to 2H will be omitted for the purpose of ease and convenience in explanation. In other words, differences between the present embodiment and the embodiment of FIGS. 1 and 2A to 2H will be mainly described hereinafter.

Referring to FIGS. 13 and 14A to 14F, a substrate 100 having a third region RG3 and a fourth region RG4 may be provided. The third region RG3 and the fourth region RG4 may be a logic cell region on which logic transistors for constituting a logic circuit are disposed, or a peripheral circuit region on which high-voltage transistors for constituting an I/O terminal are disposed.

A plurality of active patterns AP extending in a second direction D2 may be provided on the third region RG3 and the fourth region RG4. Widths of the active patterns AP on the third region RG3 may be substantially equal to widths of the active patterns AP on the fourth region RG4. A distance (or a pitch) between the active patterns AP adjacent to each other on the third region RG3 may be substantially equal to a distance (or a pitch) between the active patterns AP adjacent to each other on the fourth region RG4.

A first trench TR1 may be defined between the active patterns AP adjacent to each other on the third region RG3. A second trench TR2 may be defined between the active patterns AP adjacent to each other on the fourth region RG4. The second trench TR2 may be deeper than the first trench TR1. In other words, heights (i.e., vertical lengths) of the active patterns AP on the third region RG3 may be smaller than those of the active patterns AP on the fourth region RG4.

Each of the active patterns AP on the fourth region RG4 may include a first portion PA1 and a second portion PA2 on the first portion PA1. The first portion PA1 may correspond to a lower portion of the active pattern AP, and the second portion PA2 may correspond to an upper portion of the active pattern AP. A width of the active pattern AP in a first direction D1 may decrease as a distance from a bottom surface of the substrate 100 increases. The width of the active pattern AP may sharply (discontinuously) decrease at a boundary between the first portion PA1 and the second portion PA2. In other words, a sidewall of the active pattern AP may have a stepped profile at the boundary between the first portion PA1 and the second portion PA2.

Liner layers LIN may be provided on both sidewalls of the second portion PA2 of the active pattern AP on the fourth region RG4. An outer sidewall of the liner layer LIN may be aligned with a sidewall of the first portion PA1 of the active pattern AP. For example, the liner layer LIN may include at least one of a silicon nitride layer, a silicon oxide layer, or a poly-silicon layer. In certain embodiments, the liner layer LIN may have a multi-layered structure formed of at least two of the silicon nitride layer, the silicon oxide layer, or the poly-silicon layer. On the other hand, a liner layer may not exist on the third region RG3.

In the present embodiment, all of transistors on the third region RG3 and the fourth region RG4 may be P-channel MOS field effect transistors (PMOSFETs) or N-channel MOS field effect transistors (NMOSFETs). Alternatively, a conductivity type of the transistors of the third region RG3 may be different from that of the transistors of the fourth region RG4. However, embodiments of the inventive concepts are not limited thereto.

FIG. 15 is a plan view illustrating a method for manufacturing a semiconductor device according to some embodiments of the inventive concepts. FIGS. 16A, 17A, 18A, and 19A are cross-sectional views taken along a line A-A' of FIG. 15. FIGS. 16B, 17B, 18B, and 19B are cross-sectional views taken along a line B-B' of FIG. 15. FIGS. 16C, 17C, 18C, and 19C are cross-sectional views taken along a line C-C' of FIG. 15. FIGS. 16D, 17D, 18D, and 19D are cross-sectional views taken along a line D-D' of FIG. 15. In the present embodiment, the descriptions to the same technical features as in the embodiment of FIGS. 3 to 11H will be omitted for the purpose of ease and convenience in explanation. In other words, differences between the present embodiment and the embodiment of FIGS. 3 to 11H will be mainly described hereinafter.

Referring to FIGS. 15 and 16A to 16D, a substrate 100 having a third region RG3 and a fourth region RG4 may be provided. The third region RG3 and the fourth region RG4 may be a logic cell region or a peripheral circuit region. The substrate 100 may be patterned to form active patterns AP. The formation of the active patterns AP may include forming mask patterns MA on the substrate 100, and anisotropically etching the substrate 100 using the mask patterns MA as etch masks. First trenches TR1 may be formed between the active patterns AP.

Referring to FIGS. 15 and 17A to 17D, a mold layer MO may be formed on the third region RG3. The mold layer MO may completely cover the active patterns AP on the third region RG3. The mold layer MO may expose the fourth region RG4.

Liner layers LIN may be formed to cover exposed sidewalls of the active patterns AP on the fourth region RG4. In more detail, a liner layer LIN may be conformally formed on the substrate 100, and the conformal liner layer LIN may be anisotropically etched. Thus, the liner layers LIN having spacer shapes may be formed on the sidewalls of the active patterns AP of the fourth region RG4. On the other hand, the third region RG3 may be protected by the mold layer MO, and thus the liner layers LIN may not be formed on the active patterns AP of the third region RG3.

Referring to FIGS. 15 and 18A to 18D, the substrate 100 may be etched using the mold layer MO, the mask patterns MA and the liner layers LIN as etch masks to form second trenches TR2 in the substrate 100 of the fourth region RG4. Due to the mold layer MO, the substrate 100 of the third region RG3 may not be etched during the etching process. The second trenches TR2 of the fourth region RG4 may be deeper than the first trenches TR1 of the third region RG3. Meanwhile, each of the active patterns AP on the fourth region RG4 may include a first portion PA1 and a second portion PA2 on the first portion PA1.

Since the liner layers LIN are used as the etch masks in the etching process, a sidewall of the first portion PA1 of the active pattern AP of the fourth region RG4 may be aligned with an outer sidewall of the liner layer LIN. A sidewall of the active pattern AP of the fourth region RG4 may have a stepped profile at a boundary between the first portion PA1 and the second portion PA2.

Referring to FIGS. 15 and 19A to 19D, the mold layer MO may be removed. A device isolation layer ST may be formed in the first and second trenches TR1 and TR2. In more detail, an insulating layer may be formed on the substrate 100 to completely cover the active patterns AP. The insulating layer may be planarized until top surfaces of the active patterns AP are exposed. At this time, the mask patterns MA may be removed. Thereafter, the planarized insulating layer may be recessed to expose upper portions of the active patterns AP. The recessed insulating layer may correspond to the device isolation layer ST. The liner layers LIN may also be recessed when the insulating layer is recessed.

Referring again to FIGS. 13 and 14A to 14F, as described above with reference to FIGS. 6 to 11H, sacrificial patterns may be formed, source/drain regions SD may be formed at both sides of each of the sacrificial patterns, and the sacrificial patterns may be replaced with gate electrodes GE.

In the semiconductor device according to some embodiments of the inventive concepts, the liner layer may be provided on a region in which a distance between the active patterns is relatively wide. The liner layer may protect the source/drain of the NMOSFET. In addition, the liner layer may prevent the active patterns from leaning and may provide the tensile stress to the channel of the NMOSFET.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device comprising:
    forming a first active fin and a second active fin on a first active region and a second active region of a substrate, respectively;
    forming a device isolation layer to cover sidewalls of lower portions of the first active fin and the second active fin;
    forming a first liner layer and a second liner layer to cover upper portions of the first active fin and the second active fin, respectively;
    performing a thermal treatment process on the substrate to oxidize the first liner layer;
    forming a first gate electrode and a second gate electrode on the first active fin and the second active fin, respectively; and
    forming a first source/drain region and a second source/drain region on the first active fin and the second active fin, respectively,
    wherein the first liner layer includes a material that is different from a material of the second liner layer.

2. The method of claim 1, further comprising forming a second air gap between the second source/drain region and the second liner layer.

3. The method of claim 1, wherein the first liner layer includes a poly-silicon layer, and
    wherein the second liner layer includes a silicon nitride layer.

4. The method of claim 1, further comprising forming an etch stop layer on the first source/drain region and the second source/drain region,
    wherein the etch stop layer covers the second liner layer.

5. The method of claim 4, wherein the second liner layer under the second source/drain region covers a sidewall of an upper portion of the second active fin and a top surface of the device isolation layer.

6. The method of claim 5, wherein the second liner layer and the etch stop layer constitute a protective insulating layer, and
    wherein a thickness of the protective insulating layer on the sidewall of the upper portion of the second active fin is greater than a thickness of the protective insulating layer on the second source/drain region.

7. The method of claim 1, further comprising forming an insulating pattern between the second gate electrode and the second liner layer.

8. The method of claim 1, wherein the upper portions of the first active fin and the second active fin vertically protrude above a top surface of the device isolation layer.

9. The method of claim 1, further comprising forming a first air gap between the first source/drain region and the device isolation layer.

10. A method for manufacturing a semiconductor device comprising:
forming a first active fin and a second active fin on a first active region and a second active region of a substrate, respectively;
forming a device isolation layer to cover sidewalls of lower portions of the first active fin and the second active fin;
forming a first gate electrode and a second gate electrode on the first active fin and the second active fin, respectively;
forming a first source/drain region and a second source/drain region on the first active fin and the second active fin, respectively;
forming a protective insulating layer on sidewalls of upper portions of the first active fin and the second active fin, and the first source/drain region and the second source/drain region;
forming a first air gap between the first source/drain region and the device isolation layer; and
forming a second air gap between the second source/drain region and the protective insulating layer under the second source/drain region,
wherein a lowermost level of the first air gap is lower than a lowermost level of the second air gap.

11. The method of claim 10, wherein the upper portions of the first active fin and the second active fin vertically protrude above a top surface of the device isolation layer.

12. The method of claim 10, wherein forming the protective insulating layer comprises:
forming a first liner layer and a second liner layer to cover the upper portions of the first active fin and the second active fin, respectively; and
forming an etch stop layer on the second liner layer, and the first source/drain region and the second source/drain region.

13. The method of claim 12, wherein forming the protective insulating layer further comprises performing a thermal treatment process on the substrate to oxidize the first liner layer.

14. The method of claim 10, wherein a thickness of the protective insulating layer on a sidewall of an upper portion of the second active fin is greater than a thickness of the protective insulating layer on the second source/drain region.

15. A method for manufacturing a semiconductor device comprising:
forming a first active fin and a second active fin on a first active region and a second active region of a substrate, respectively;
forming a device isolation layer to cover sidewalls of lower portions of the first active fin and the second active fin;
forming a first gate electrode and a second gate electrode on the first active fin and the second active fin, respectively;
forming a first source/drain region and a second source/drain region on the first active fin and the second active fin, respectively; and
forming a protective insulating layer on sidewalls of upper portions of the first active fin and the second active fin, and the first source/drain region and the second source/drain region,
wherein a thickness of the protective insulating layer on a sidewall of an upper portion of the second active fin is greater than a thickness of the protective insulating layer on the second source/drain region, and
wherein a thickness of the protective insulating layer on a sidewall of an upper portion of the first active fin is substantially the same with a thickness of the protective insulating layer on the first source/drain region.

16. The method of claim 15, wherein the upper portions of the first active fin and the second active fin vertically protrude above a top surface of the device isolation layer.

17. The method of claim 15, wherein forming the protective insulating layer comprises:
forming a first liner layer and a second liner layer to cover the upper portions of the first active fin and the second active fin, respectively; and
forming an etch stop layer on the second liner layer, and the first source/drain region and the second source/drain region.

18. The method of claim 17, wherein forming the protective insulating layer further comprises performing a thermal treatment process on the substrate to oxidize the first liner layer.

19. The method of claim 17, wherein forming the protective insulating layer further comprises forming an insulating pattern between the second gate electrode and the second liner layer.

* * * * *